US012424567B2

(12) United States Patent
Chen et al.

(10) Patent No.: US 12,424,567 B2
(45) Date of Patent: Sep. 23, 2025

(54) CHIP PACKAGE AND MANUFACTURING METHOD THEREOF

(71) Applicant: XINTEC INC., Taoyuan (TW)

(72) Inventors: Hsin-Yi Chen, Taoyuan (TW); Sheng-Hsiang Fu, Taoyuan (TW); Ching Ting Peng, Taoyuan (TW); Ho Yin Yiu, Hsinchu (TW)

(73) Assignee: Xintec Inc., Taoyuan (TW)

( * ) Notice: Subject to any disclaimer, the term of this patent is extended or adjusted under 35 U.S.C. 154(b) by 528 days.

(21) Appl. No.: 17/895,643

(22) Filed: Aug. 25, 2022

(65) Prior Publication Data

US 2023/0081775 A1   Mar. 16, 2023

Related U.S. Application Data

(60) Provisional application No. 63/243,076, filed on Sep. 10, 2021.

(51) Int. Cl.
| | | |
|---|---|---|
| *H01L 23/06* | (2006.01) | |
| *H01L 21/48* | (2006.01) | |
| *H01L 23/498* | (2006.01) | |
| *H01L 23/552* | (2006.01) | |

(52) U.S. Cl.
CPC ......... *H01L 23/552* (2013.01); *H01L 21/486* (2013.01); *H01L 23/49827* (2013.01); *H01L 23/49838* (2013.01); *H01L 23/49866* (2013.01)

(58) Field of Classification Search
CPC ......... H01L 23/49827; H01L 23/49838; H01L 23/49866
See application file for complete search history.

(56) References Cited

U.S. PATENT DOCUMENTS

| | | | |
|---|---|---|---|
| 2014/0048914 | A1 | 2/2014 | Lin et al. |
| 2016/0233260 | A1* | 8/2016 | Yiu .................... H10F 77/50 |

FOREIGN PATENT DOCUMENTS

| | | |
|---|---|---|
| CN | 104733422 | 12/2017 |
| TW | 202005051 | 1/2020 |

* cited by examiner

*Primary Examiner* — Trang Q Tran
(74) *Attorney, Agent, or Firm* — LIU & LIU

(57) ABSTRACT

A chip package includes a semiconductor substrate, an interlayer dielectric (ILD) layer, a first metal shielding layer, and a redistribution layer. The semiconductor substrate has a first surface, a second surface facing away from the first surface, an inclined sidewall adjoining the first and second surfaces, and a through hole through the first and second surfaces. The ILD layer is located on the first surface of the semiconductor substrate, and a first conductive pad structure and a second conductive pad structure are disposed in the ILD layer. The first metal shielding layer is located on the ILD layer. A portion of the first metal shielding layer is located in the ILD layer and on the second conductive pad structure. The redistribution layer is located on the second surface of the semiconductor substrate, a wall surface of the through hole, and the first conductive pad structure.

25 Claims, 27 Drawing Sheets

100

CHIP PACKAGE AND MANUFACTURING METHOD THEREOF

RELATED APPLICATIONS

This application claims priority to U.S. Provisional Application Ser. No. 63/243,076, filed Sep. 10, 2021, which is herein incorporated by reference.

BACKGROUND

Field of Invention

The present disclosure relates to a chip package and a manufacturing method of the chip package.

Description of Related Art

Generally speaking, in order to protect a chip package from electromagnetic interference (EMI), after a molding process is performed on the chip package, an iron frame or a cover plate is disposed around the molding compound of the chip package to act as a metal shielding layer for EMI.

However, disposing an iron frame or a cover plate for metal shielding requires additional processes (e.g., heat treatment) and materials, resulting in increased manufacturing costs. In addition, in order to reduce electromagnetic interference, the circuit layout of the chip package may be limited. Moreover, the molding material and the iron frame would increase the thickness and weight of the entire structure, which is not conducive to miniaturization design. Furthermore, the heat generated by the chip package needs to be conducted to the iron frame or the cover through the molding material, thereby being not conducive to heat dissipation.

SUMMARY

One aspect of the present disclosure provides a chip package.

According to some embodiments of the present disclosure, a chip package includes a semiconductor substrate, an interlayer dielectric (ILD) layer, a first metal shielding layer, and a redistribution layer. The semiconductor substrate has a first surface, a second surface facing away from the first surface, an inclined sidewall adjoining the first and second surfaces, and a through hole through the first and second surfaces. The ILD layer is located on the first surface of the semiconductor substrate, and a first conductive pad structure and a second conductive pad structure are disposed in the ILD layer. The first metal shielding layer is located on the ILD layer. A portion of the first metal shielding layer is located in the ILD layer and on the second conductive pad structure. The redistribution layer is located on the second surface of the semiconductor substrate, a wall surface of the through hole, and the first conductive pad structure.

In some embodiments, the chip package further includes a second metal shielding layer. The second metal shielding layer is located on the second surface of the semiconductor substrate and the inclined sidewall.

In some embodiments, the second metal shielding layer is in electrical contact with the second conductive pad structure.

In some embodiments, a material of the first metal shielding layer is the same as a material of the second metal shielding layer.

In some embodiments, the material of the second metal shielding layer includes copper or aluminum.

In some embodiments, the chip package further includes an isolation layer that covers the second metal shielding layer, and is located between the redistribution layer and the second surface of the semiconductor substrate, and is located between the redistribution layer and the wall surface of the through hole.

In some embodiments, the chip package further includes a protection layer covering the redistribution layer and the isolation layer.

In some embodiments, the chip package further includes a conductive structure protruding from the protection layer and in electrical contact with the redistribution layer that is on the second surface.

In some embodiments, a material of the first metal shielding layer includes copper or aluminum.

In some embodiments, the redistribution layer is in contact with the second surface of the semiconductor substrate, the wall surface of the through hole, and the first conductive pad structure.

In some embodiments, the redistribution layer is in electrical contact with the second conductive pad structure.

In some embodiments, the chip package further includes a bonding layer and a cover. The bonding layer covers the first conductive pad structure, the ILD layer, and the first metal shielding layer. The cover is located on the bonding layer.

In some embodiments, the cover has a recess, and the chip package further includes a second metal shielding layer extending from the second surface of the semiconductor substrate along the inclined sidewall of the semiconductor substrate into the recess of the cover.

In some embodiments, a lateral surface of the second metal shielding layer is in contact with the bonding layer and the first metal shielding layer.

In some embodiments, the chip package further includes an isolation layer covering the second metal shielding layer and extending into the recess of the cover.

In some embodiments, the redistribution layer extends from the second surface of the semiconductor substrate along the inclined sidewall of the semiconductor substrate to a lateral surface of the first metal shielding layer.

Another aspect of the present disclosure provides a manufacturing method of a chip package.

According to some embodiments of the present disclosure, a manufacturing method of a chip package includes forming an interlayer dielectric (ILD) layer on a first metal shielding layer on a first surface of a semiconductor substrate, wherein a first conductive pad structure and a second conductive pad structure are disposed in the ILD layer, and a portion of the first metal shielding layer is located in the ILD layer and on the second conductive pad structure; bonding, by a bonding layer, the first metal shielding layer to a cover; forming a through hole in the semiconductor substrate, wherein the through hole through the first surface and a second surface that faces away from the first surface; forming a redistribution layer on the second surface of the semiconductor substrate, a wall surface of the through hole, and the first conductive pad structure; and after forming the redistribution layer, removing or retaining the bonding layer and the cover.

In some embodiments, the manufacturing method of the chip package further includes etching the ILD layer to expose the first conductive pad structure and the second conductive pad structure.

In some embodiments, the manufacturing method of the chip package further includes when forming a through hole in the semiconductor substrate, simultaneously forming a dicing trench in the semiconductor substrate, such that the semiconductor substrate has an inclined sidewall facing toward the dicing trench.

In some embodiments, the manufacturing method of the chip package further includes forming a photoresist layer on the second surface of the semiconductor substrate, wherein the photoresist layer covers the through hole, and the dicing trench is free from coverage by the photoresist layer.

In some embodiments, the manufacturing method of the chip package further includes forming a second metal shielding layer on the second surface of the semiconductor substrate, the inclined sidewall, and the second conductive pad structure; and removing the photoresist layer.

In some embodiments, the manufacturing method of the chip package further includes forming an isolation layer on the second metal shielding layer, the second surface of the semiconductor substrate, and the inclined sidewall; and forming a protection layer to cover the redistribution layer and the isolation layer.

In some embodiments, the manufacturing method of the chip package further includes forming an opening in the protection layer to expose a portion of the redistribution layer; and forming a conductive structure on said portion of the redistribution layer.

In some embodiments, the manufacturing method of the chip package further includes cutting the semiconductor substrate along the dicing trench.

In some embodiments, the manufacturing method of the chip package further includes cutting the second conductive pad structure, the first metal shielding layer, the bonding layer, and the cover along the dicing trench, such that the cover has a recess in communication with the dicing trench.

In some embodiments, the manufacturing method of the chip package further includes forming a second metal shielding layer that extends from the second surface of the semiconductor substrate along the inclined sidewall of the semiconductor substrate into the recess of the cover.

In some embodiments, the manufacturing method of the chip package further includes forming an isolation layer that covers the second metal shielding layer and extends into the recess of the cover.

In some embodiments, the manufacturing method of the chip package further includes forming the redistribution layer such that the redistribution layer extends from the second surface of the semiconductor substrate along the inclined sidewall of the semiconductor substrate to a lateral surface of the first metal shielding layer.

In some embodiments, forming the redistribution layer on the second surface of the semiconductor substrate, the wall surface of the through hole, and the first conductive pad structure is performed such that the redistribution layer is in contact with the second surface, the wall surface of the through hole, and the first conductive pad structure.

In some embodiments, the manufacturing method of the chip package further includes after forming the redistribution layer, adhering the semiconductor substrate to an adhesive tape.

In the aforementioned embodiments of the present disclosure, since the chip package has the first metal shielding layer on and in the ILD layer, the first metal shielding layer can provide protection for electromagnetic interference (EMI) in chip level. The first metal shielding layer may replace an iron frame (or a cover) traditionally used for metal shielding, and the formation of the first metal shielding layer may be integrated in the manufacturing process of the chip package, thereby effectively saving the manufacturing cost. Moreover, because the first metal shielding layer may provide EMI protection, the circuit layout of the chip package may be more flexible. In addition, the chip package does not need to dispose a molding material or an iron frame (or a cover), which may reduce thickness and weight and facilitates miniaturization design. Furthermore, the heat generated by the chip package may be directly conducted by the first metal shielding layer, which is helpful for heat dissipation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
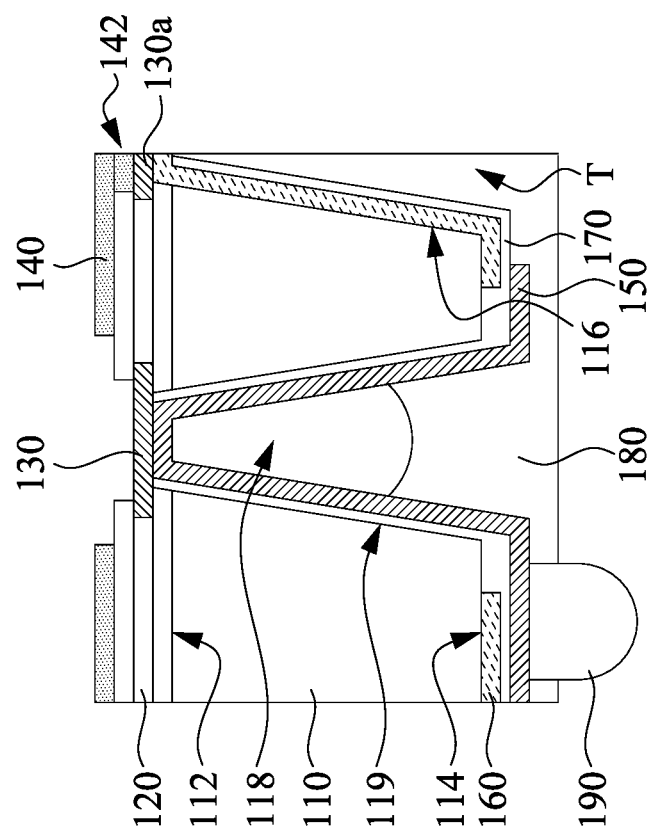
FIG. 1 is a cross-sectional view of a chip package according to one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view of a chip package 100 according to one embodiment of the present disclosure. As shown in FIG. 1, the chip package 100 includes a semiconductor substrate 110, an interlayer dielectric (ILD) layer 120, a first metal shielding layer 140, and a redistribution layer 150. The semiconductor substrate 110 has a first surface 112, a second surface 114, an inclined sidewall 116, and a through hole 118. The second surface 114 faces away from the first surface 112. The inclined sidewall 116 adjoins the first and second surfaces 112 and 114. The through hole 118 extends through the first and second surfaces 112 and 114. The ILD layer 120 is located on the first surface 112 of the semiconductor substrate 110, and a first conductive pad structure 130 and a second conductive pad structure 130a of the semiconductor substrate 110 are disposed in the ILD layer 120. Each of the first conductive pad structure 130 and the second conductive pad structure 130a may be a metal structure including stacked layers. The ILD layer 120 may include stacked isolation layers, the uppermost layer may a passivation layer, and the lowermost layer may be a substrate isolation layer. The first conductive pad structure 130 can act as an input/output (I/O) conductive pad structure for signal. In other embodiments, the first conductive pad structure 130 can be electrically connected to an external electronic device through wire bonding. The second conductive pad structure 130a can act as a ground conductive pad structure. The first metal shielding layer 140 is located on the ILD layer 120. Furthermore, a portion 142 of the first metal shielding layer 140 is located in the ILD layer 120 and on the second conductive pad structure 130a. For example, the portion 142 of the first metal shielding layer 140 extends to the second conductive pad structure 130a The redistribution layer 150 is located on the second surface 114 of the semiconductor substrate 110, a wall surface 119 of the through hole 118, and the first conductive pad structure 130. In other words, the redistribution layer 150 extends from the second surface 114 of the semiconductor substrate 110 to the first conductive pad structure 130 in the through hole 118, such that the redistribution layer 150 is in electrical contact with the first conductive pad structure 130.

In this embodiment, the semiconductor substrate 110 may be a silicon substrate. The material of the first metal shielding layer 140 may include copper or aluminum, the material of the redistribution layer 150 may include copper, but the present disclosure is not limited in this regard.

Since the chip package 100 has the first metal shielding layer 140 on and in the ILD layer 120, the first metal shielding layer 140 can provide protection for electromagnetic interference (EMI) in chip level. The first metal shielding layer 140 can replace an iron frame (or a cover) traditionally used for metal shielding, and the formation of the first metal shielding layer 140 may be integrated in the manufacturing process of the chip package 100, thereby effectively saving the manufacturing cost. Moreover, because the first metal shielding layer 140 can provide EMI protection, the circuit layout of the chip package 100 may be more flexible. In addition, the chip package 100 does not need to dispose a molding material or an iron frame (or a cover), which may reduce thickness and weight and facilitates miniaturization design. Furthermore, the heat generated by the chip package 100 may be directly conducted by the first metal shielding layer 140, which is helpful for heat dissipation.

Moreover, the chip package 100 may further include a second metal shielding layer 160. The second metal shielding layer 160 is located on the second surface 114 and the inclined sidewall 116 of the semiconductor substrate 110. The second metal shielding layer 160 is in electrical contact with the second conductive pad structure 130a. The material of the second metal shielding layer 160 is the same as the material of the first metal shielding layer 140. For example, the material of the second metal shielding layer 160 includes copper or aluminum. The function of the second metal shielding layer 160 is similar to that of the first metal shielding layer 140, thereby further providing EMI protection.

In this embodiment, the chip package 100 further includes an isolation layer 170 that covers the second metal shielding layer 160. The isolation layer 170 is located between the redistribution layer 150 and the second surface 114 of the semiconductor substrate 110, and is located between the redistribution layer 150 and the wall surface 119 of the through hole 118. The material of the isolation layer 170 may include silicon dioxide ($SiO_2$), but the present disclosure is not limited in this regard.

In addition, the chip package 100 may further include a protection layer 180 and a conductive structure 190. The protection layer 180 covers the redistribution layer 150 and the isolation layer 170. The conductive structure 190 protrudes from the protection layer 180 and in electrical contact with the redistribution layer 150 that is on the second surface 114. The protection layer 180 may serve as a passivation layer and a solder mask layer, and the material of the protection layer 180 may include polymer. The conductive structure 190 may be, but not limited to a solder ball.

In the following description, the manufacturing method of the chip package 100 will be explained.

Figure 2:
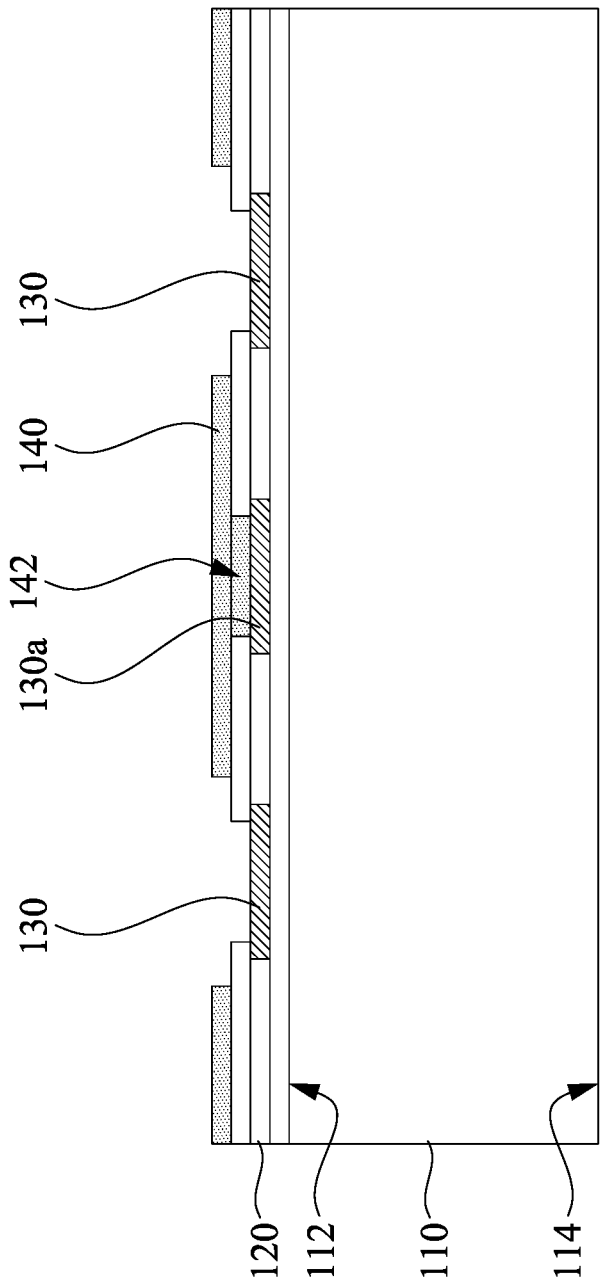
FIGS. 2 to 11 are cross-sectional views at intermediate stages of the manufacturing method of the chip package of FIG. 1.
Figure 3:
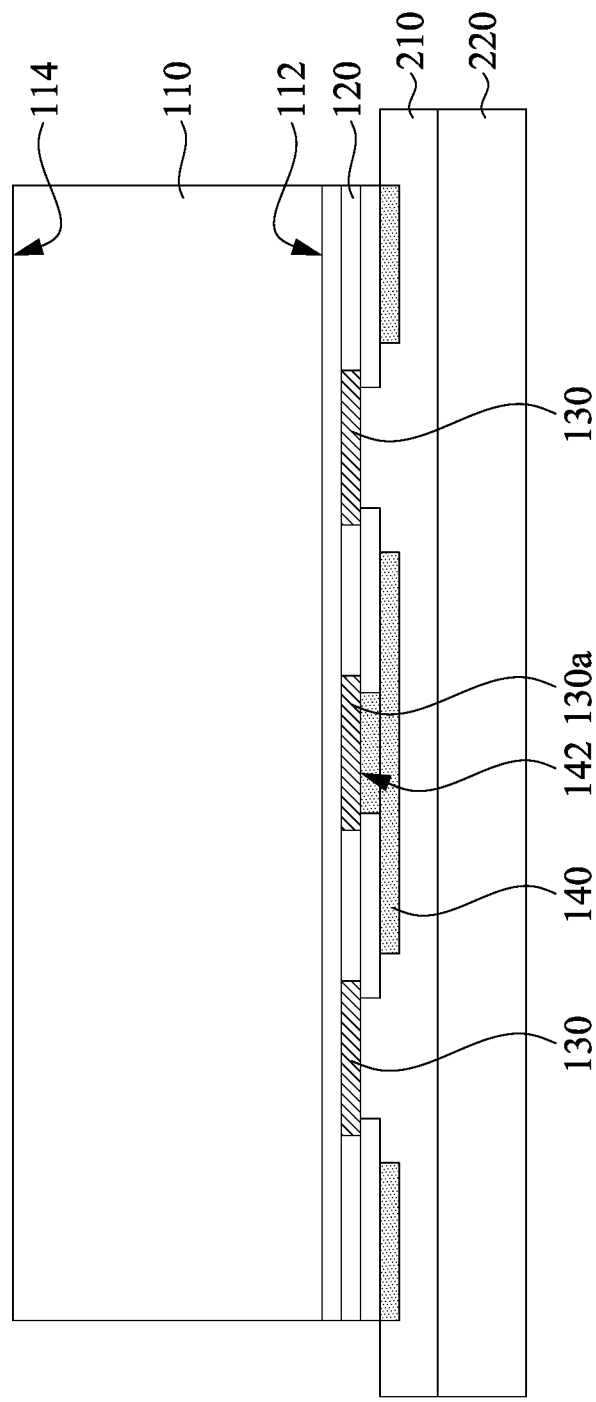

FIGS. 2 to 11 are cross-sectional views at intermediate stages of the manufacturing method of the chip package of FIG. 1. As shown in FIG. 2 and FIG. 3, the manufacturing method of the chip package 100 includes forming the first metal shielding layer 140 on the ILD layer 120 that is on the first surface 112 of the semiconductor substrate 110. The first conductive pad structure 130 and the second conductive pad structure 130a are disposed in the ILD layer 120, and the portion 142 of the first metal shielding layer 140 is located in the ILD layer 120 and on the second conductive pad structure 130a. In some embodiments, the first conductive pad structure 130 and the second conductive pad structure 130a may be formed in one layer of the ILD layer 120 in the same step, and then another layer of the ILD layer 120 covers the first conductive pad structure 130 and the second conductive pad structure 130a. Thereafter, an etching process (e.g., wet etching) may be performed to the ILD layer 120 such that openings that expose the first conductive pad structure 130 and the second conductive pad structure 130a are formed in the ILD layer 120. Subsequently, the first metal shielding layer 140 can be formed on the ILD layer 120 and the second conductive pad structure 130a. The semiconductor substrate 110 shown in FIGS. 2 to 10 is not diced yet, and may be a wafer level. After the first metal shielding layer 140 is formed, the structure of FIG. 2 may be flipped over, and the first metal shielding layer 140 is bonded to a cover 220 by a bonding layer 210, thereby obtaining the structure of FIG. 3. In this embodiment, the bonding layer 210 is a temporary bonding layer, the cover 220 is a carrier, and the temporary bonding layer and the carrier may be removed in the following steps. Thereafter, grinding the second surface 114 of the semiconductor substrate 110 may be performed to thin the semiconductor substrate 110.

Figure 4:
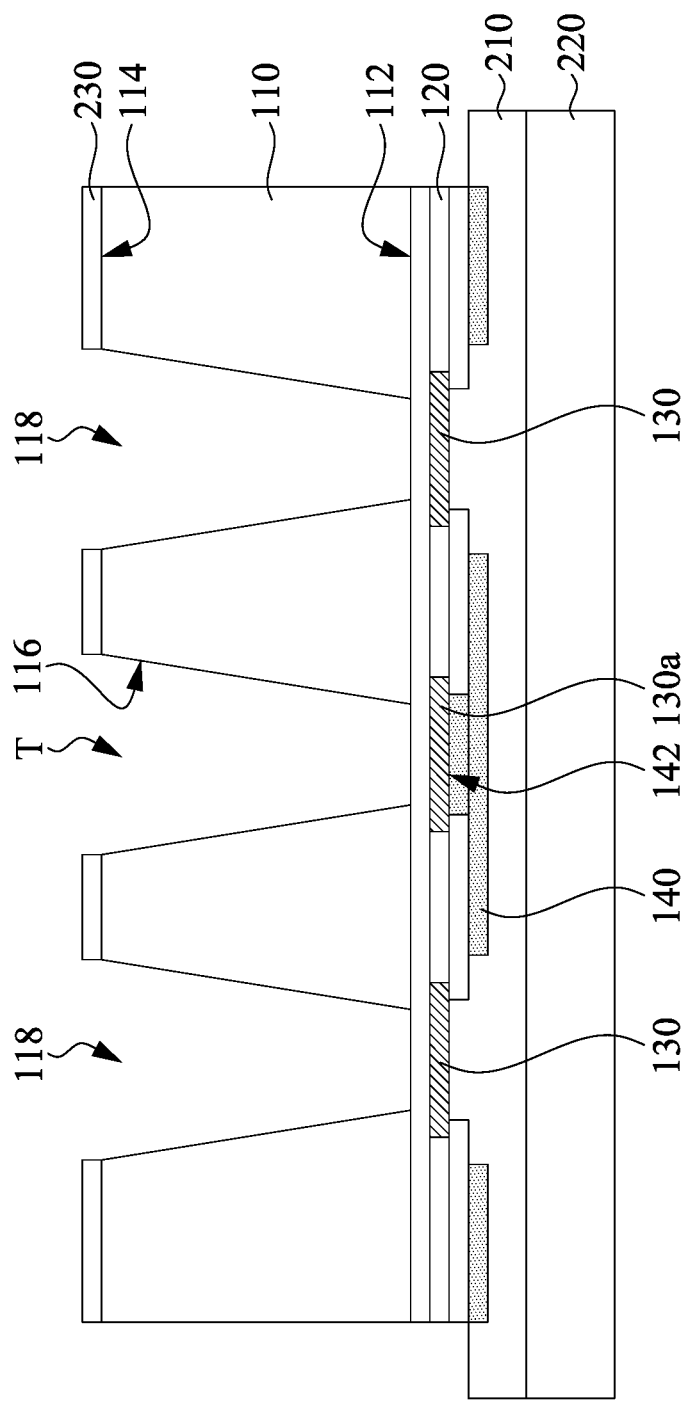

As shown in FIG. 4, thereafter, a patterned photoresist layer 230 may be formed on the second surface 114 of the semiconductor substrate 110, such that the second surface 114 not covered by the photoresist layer 230 may be etched to form the through hole 118 in the semiconductor substrate 110, in which the through hole 118 is through the first surface 112 and the second surface 114. When forming the through hole 118 in the semiconductor substrate 110, a dicing trench T may be simultaneously formed in the semiconductor substrate 110, such that the semiconductor substrate 110 has the inclined sidewall 116 facing toward the dicing trench T.

Figure 5:
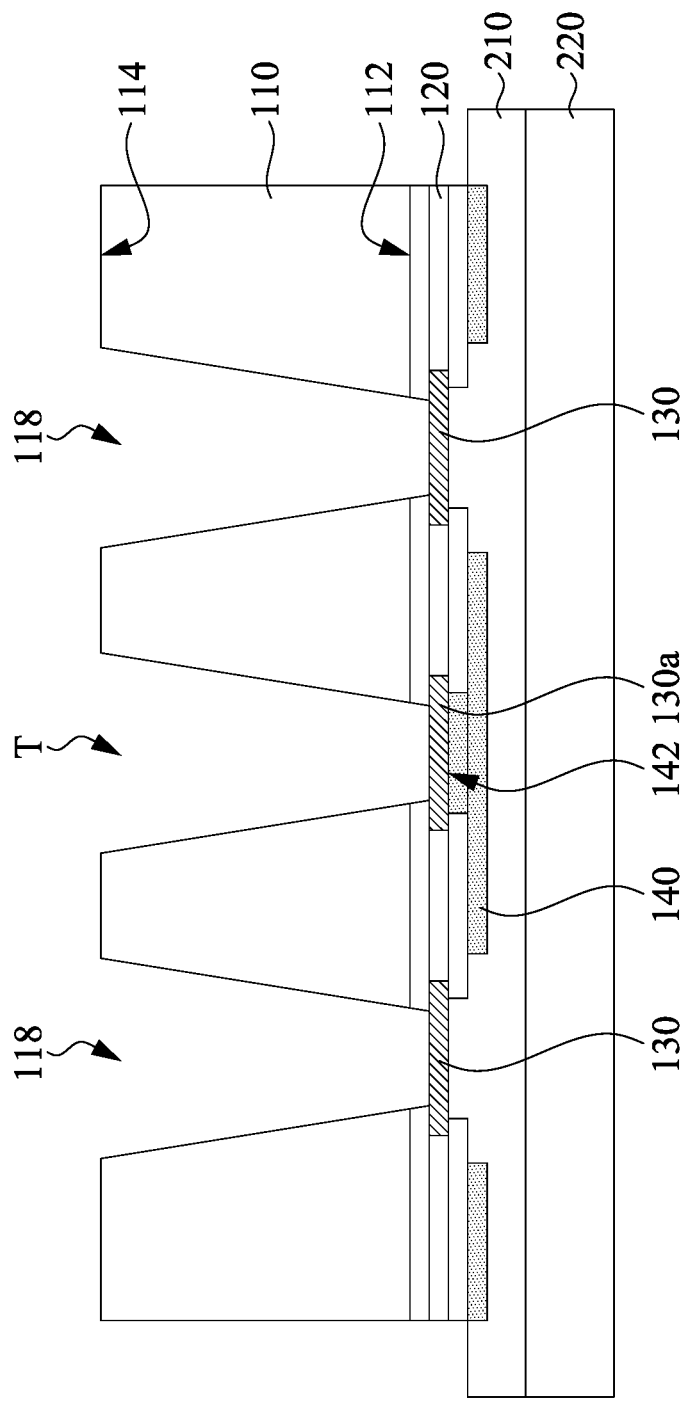

As shown in FIG. 5, thereafter, the photoresist layer 230 may be removed, and the ILD layer 120 above the first conductive pad structure 130 and the second conductive pad structure 130a are further etched, such that the first conductive pad structure 130 is exposed through the through hole 118, and the second conductive pad structure 130a is exposed through the dicing trench T.

Figure 6:
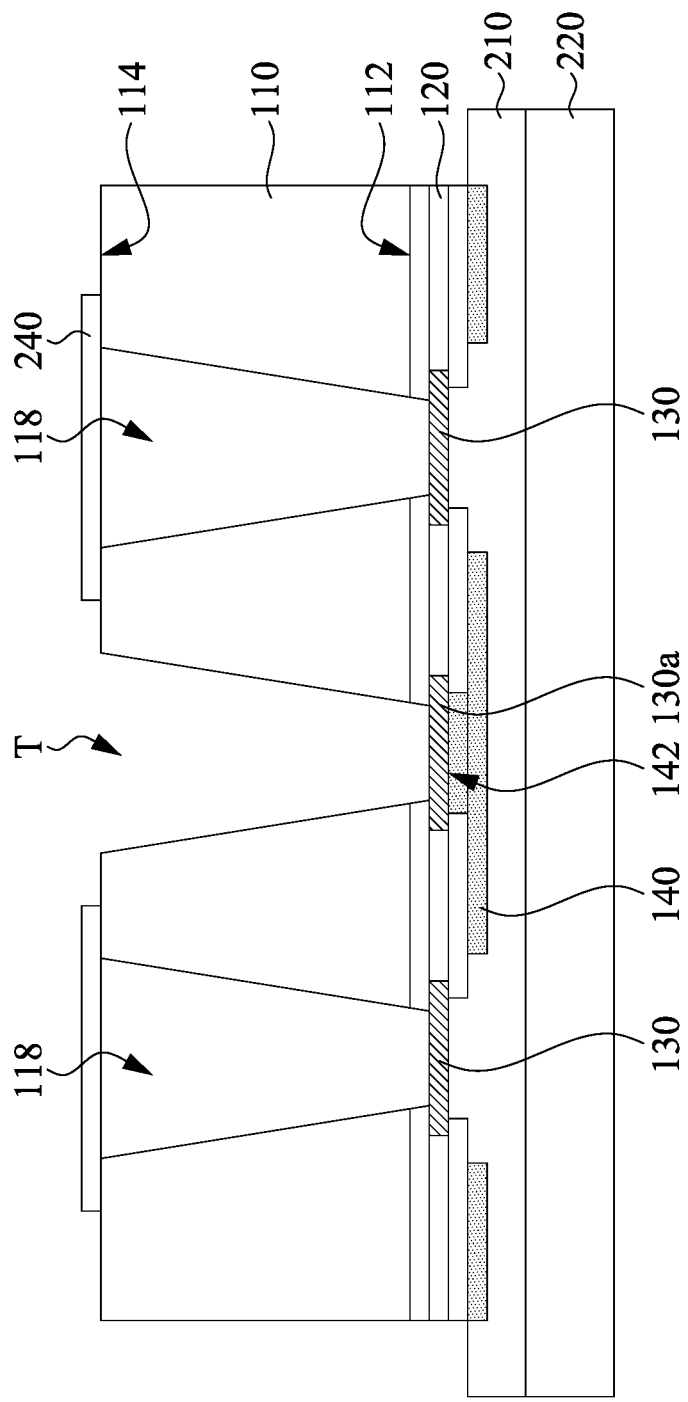

As shown in FIG. 6, thereafter, a patterned photoresist layer 240 may be formed on the second surface 114 of the semiconductor substrate 110, in which the photoresist layer 240 covers the through hole 118, and the dicing trench T is free from coverage by the photoresist layer 240.

Figure 7:
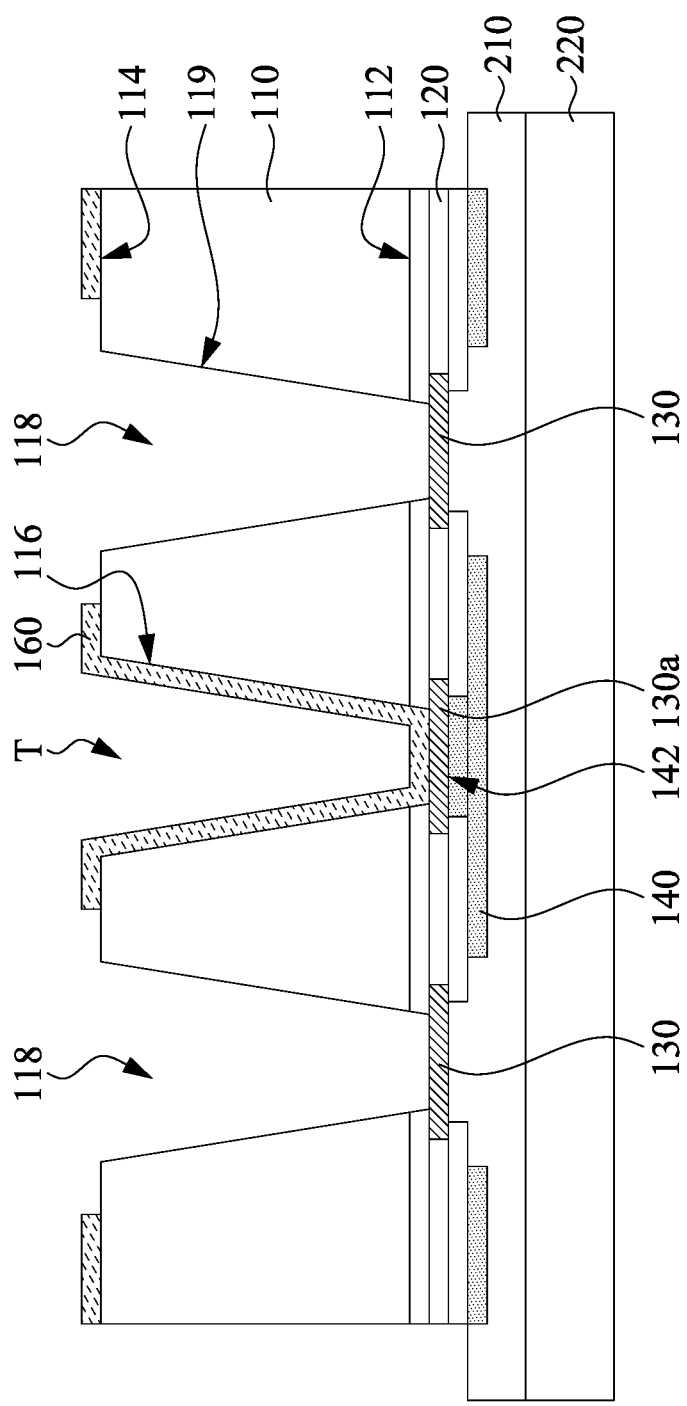

As shown in FIG. 6 and FIG. 7, after the formation of the photoresist layer 240, the second metal shielding layer 160 may be formed on the second surface 114 of the semiconductor substrate 110, the inclined sidewall 116, and the second conductive pad structure 130a. Afterwards, the photoresist layer 240 covering the through hole 118 may be removed to form the structure of FIG. 7.

Figure 8:
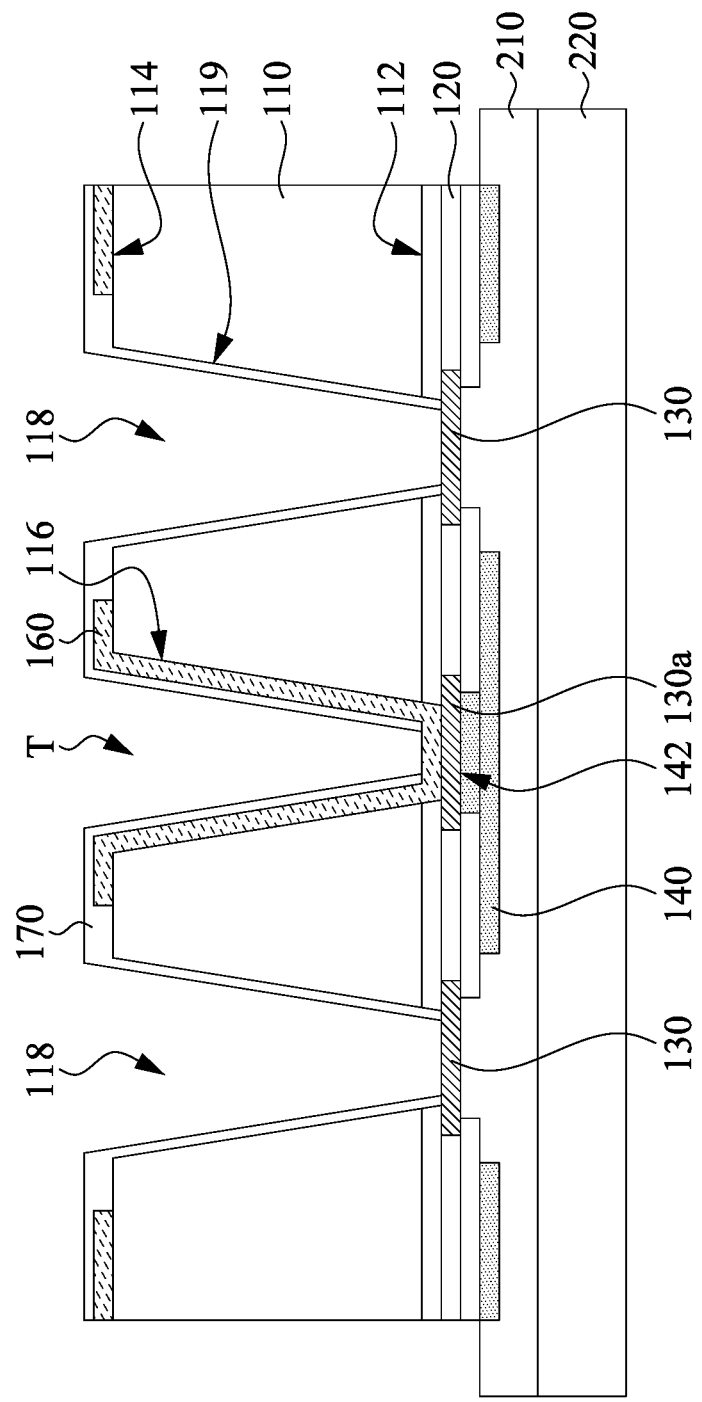

As shown in FIG. 8, thereafter, the isolation layer 170 may be formed by chemical vapor deposition (CVD), and an etching process is performed on the isolation layer 170 to expose the first conductive pad structure 130 and the second metal shielding layer 160 that is on the second conductive pad structure 130a. As a result, the isolation layer 170 may be located on the second metal shielding layer 160, the second surface 114 of the semiconductor substrate 110, and the inclined sidewall 116.

Figure 9:
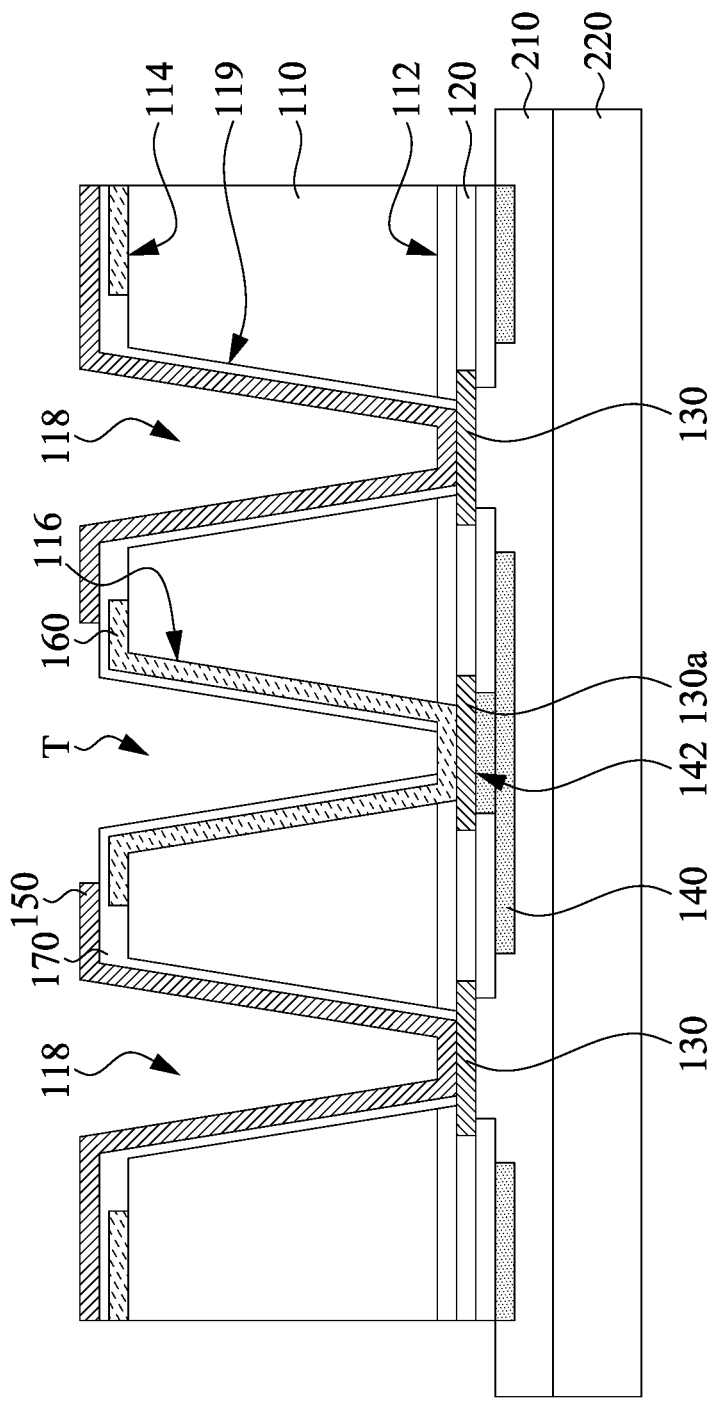

As shown in FIG. 9, thereafter, the redistribution layer 150 may be formed on the second surface 114 of the semiconductor substrate 110, the wall surface 119 of the through hole 118, and the first conductive pad structure 130. The redistribution layer 150 and the semiconductor substrate 110 are separated by the isolation layer 170, but the redistribution layer 150 is in electrical contact with the first conductive pad structure 130.

Figure 10:
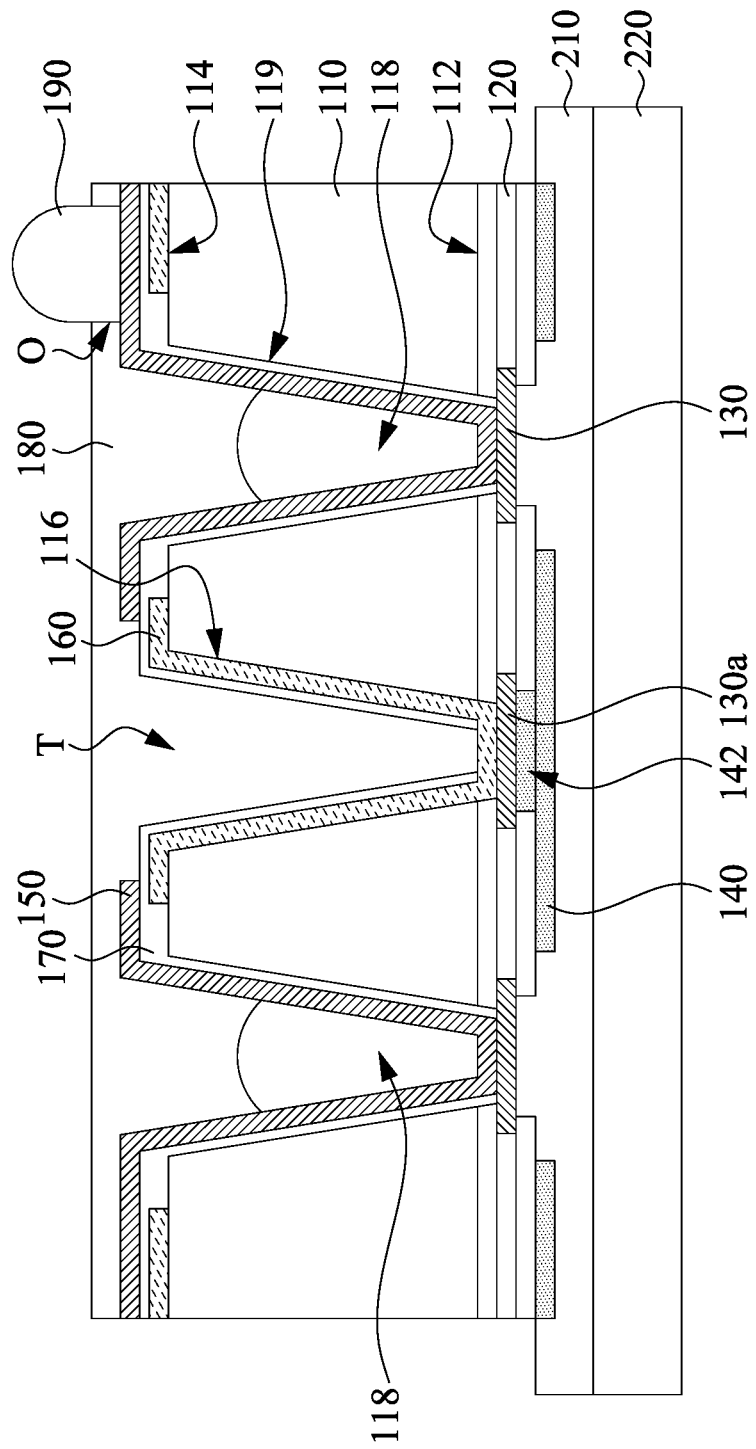

As shown in FIG. 10, after the formation of the redistribution layer 150, the protection layer 180 may be formed to cover the redistribution layer 150 and the isolation layer 170. Thereafter, an opening O is formed in the protection layer 180 to expose a portion of the redistribution layer 150, and then the conductive structure 190 is formed on said portion of the redistribution layer 150. The conductive structure 190 may protrude from the protection layer 180.

Figure 11:
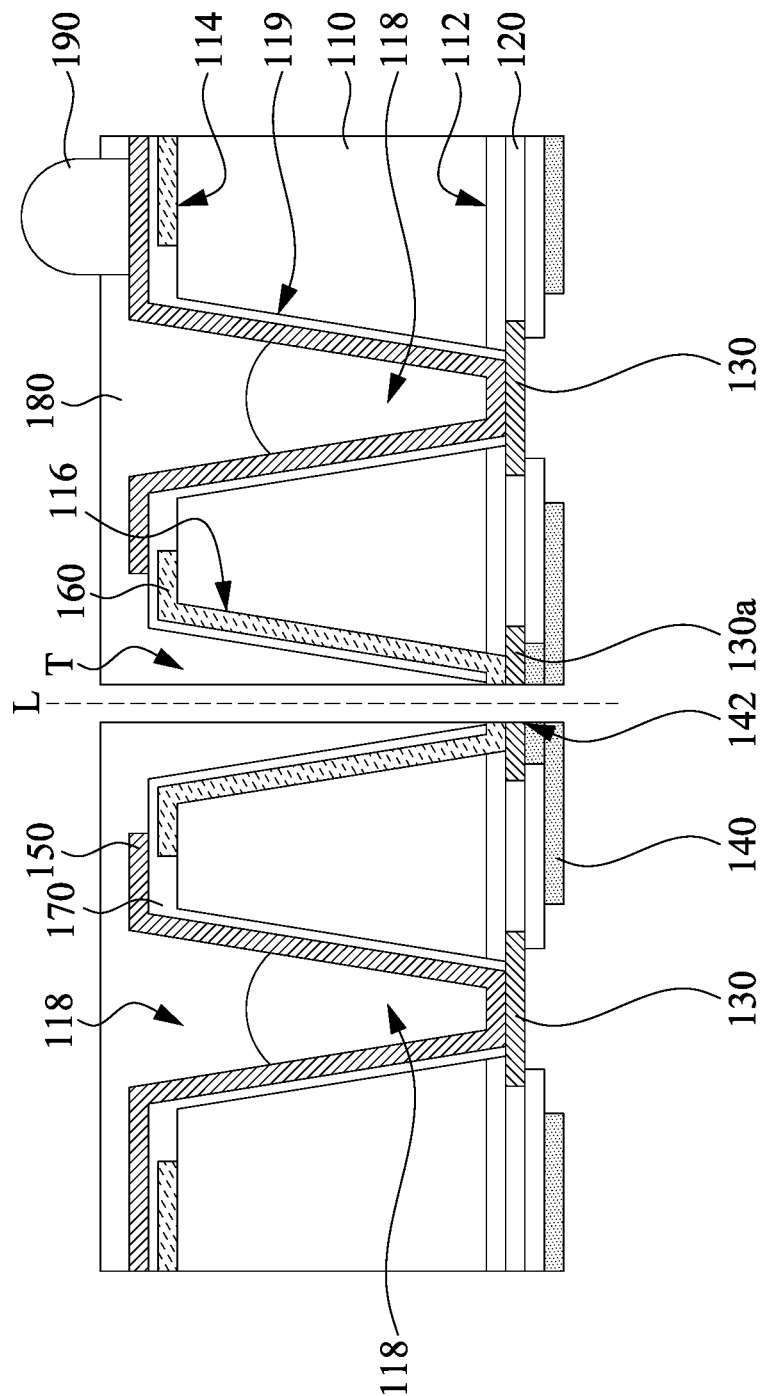

As shown in FIG. 11, after the formation of the redistribution layer 190, the bonding layer 210 and the cover 220 may be removed. Next, the semiconductor substrate 110 may be cut along the dicing trench T (e.g., line L), thereby obtaining the chip package 100 of FIG. 1.

It is to be noted that the connection relationships, the materials, and the advantages of the elements described above will not be repeated in the following description. In the following description, other types of chip packages will be described.

Figure 12:
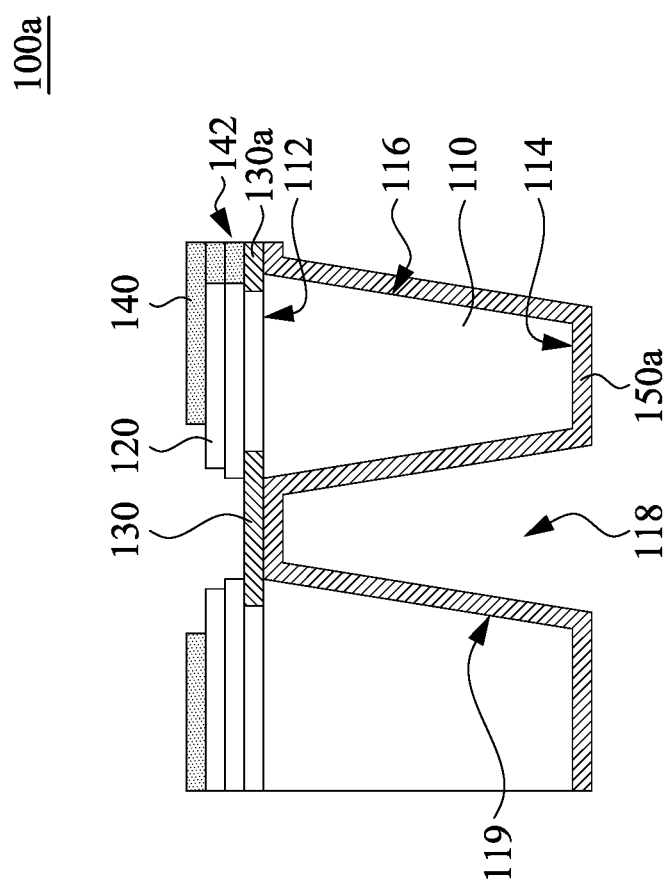
FIG. 12 is a cross-sectional view of a chip package according to one embodiment of the present disclosure.

FIG. 12 is a cross-sectional view of a chip package 100a according to one embodiment of the present disclosure. The chip package 100a includes the semiconductor substrate 110, the interlayer dielectric (ILD) layer 120, the first metal shielding layer 140, and a redistribution layer 150a. The redistribution layer 150a is in contact with the first conductive pad structure 130. The difference between this embodiment and the embodiment of FIG. 1 is that the redistribution layer 150a is further in contact with the second surface 114 of the semiconductor substrate 110, the wall surface 119 of the through hole 118, and the redistribution layer is in electrical contact with the second conductive pad structure 130a. In this embodiment, the first conductive pad structure 130 and the second conductive pad structure 130a act as ground conductive pad structures. The semiconductor substrate 110 may be a gallium nitride (GaN) substrate or a silicon carbide (SiC) substrate. The chip package 100a may be used in radio frequency (RF) device or power amplifier, but the present disclosure is not limited in this regard. In this embodiment, the chip package 100a has no second metal shielding layer 160 of FIG. 1, but the redistribution layer 150a has a shielding function similar to that of the aforementioned second metal shielding layer 160.

In the following description, the manufacturing method of the chip package 100a will be explained.

Figure 13:
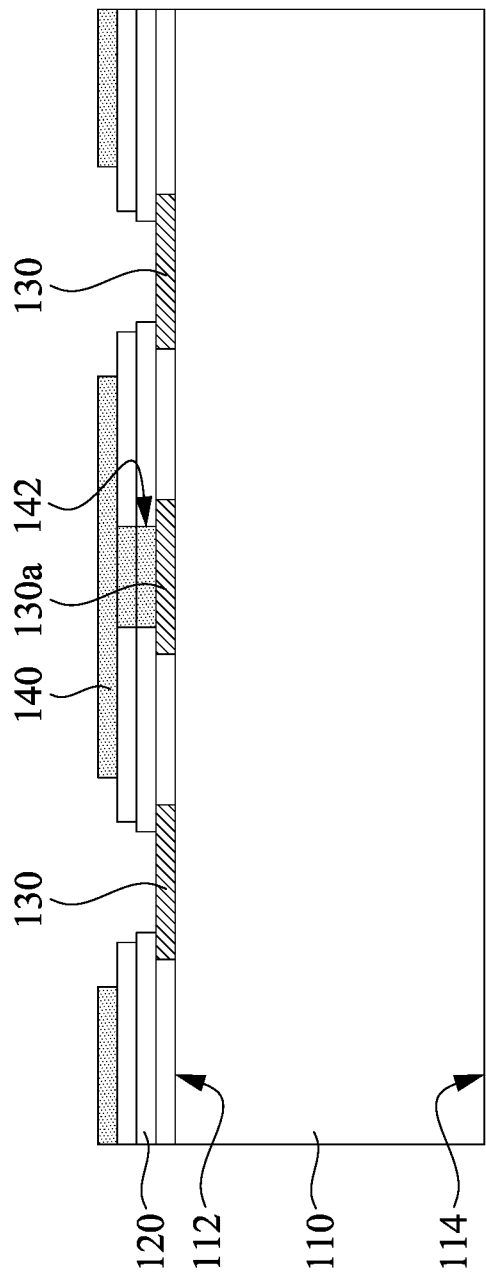
FIGS. 13 to 16 are cross-sectional views at intermediate stages of the manufacturing method of the chip package of FIG. 12.
Figure 14:
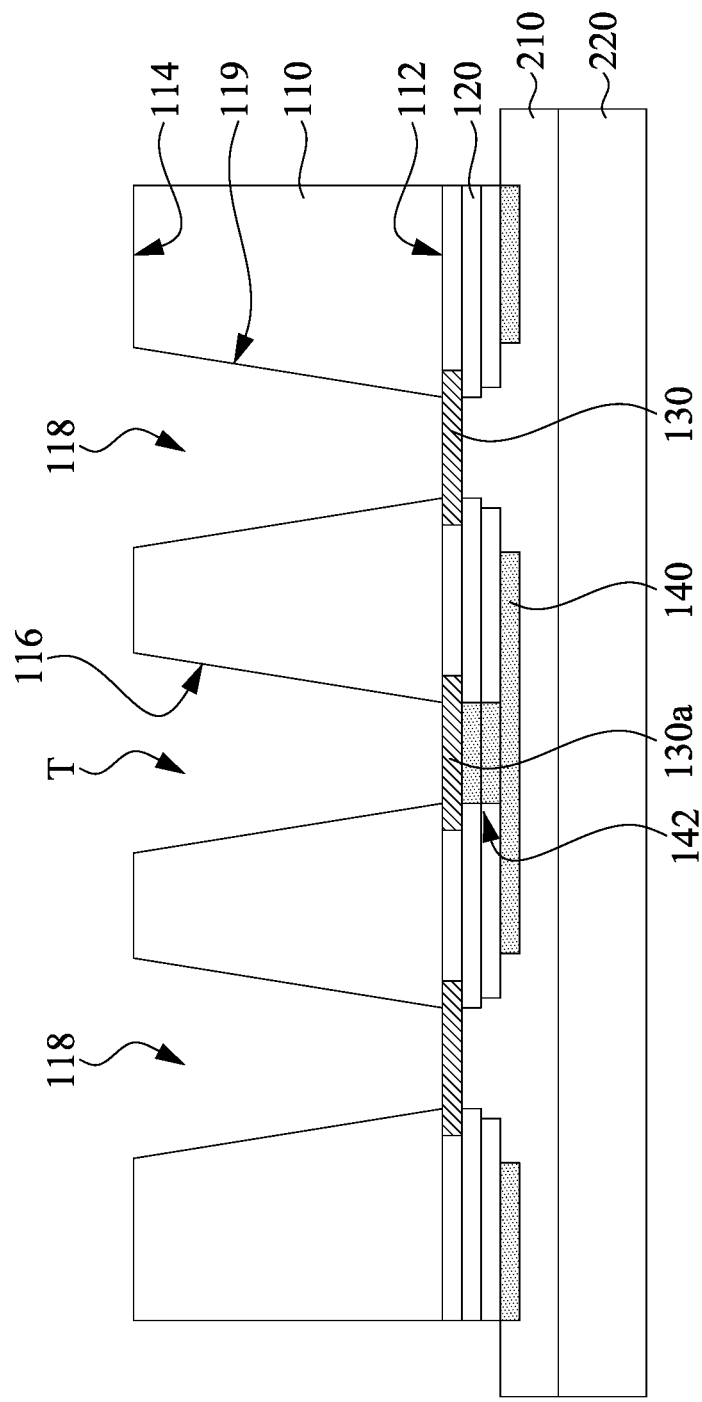

FIGS. 13 to 16 are cross-sectional views at intermediate stages of the manufacturing method of the chip package 100a of FIG. 12. As shown in FIG. 13, the difference between this embodiment and the embodiment of FIG. 2 is that the first conductive pad structure 130 and the second conductive pad structure 130a of the chip package 100a are directly located on the first surface 112 of the semiconductor substrate 110. Thereafter, the following steps may be the same as the steps of FIG. 3 and FIG. 4, and thus the structure of FIG. 14 is formed. Since the first conductive pad structure 130 and the second conductive pad structure 130a are directly located on the first surface 112 of the semiconductor substrate 110, when the through hole 118 and the dicing trench T are formed in the semiconductor substrate 110, the first conductive pad structure 130 can be exposed through the through hole 118 and the second conductive pad structure 130a can be exposed through the dicing trench T.

Figure 15:
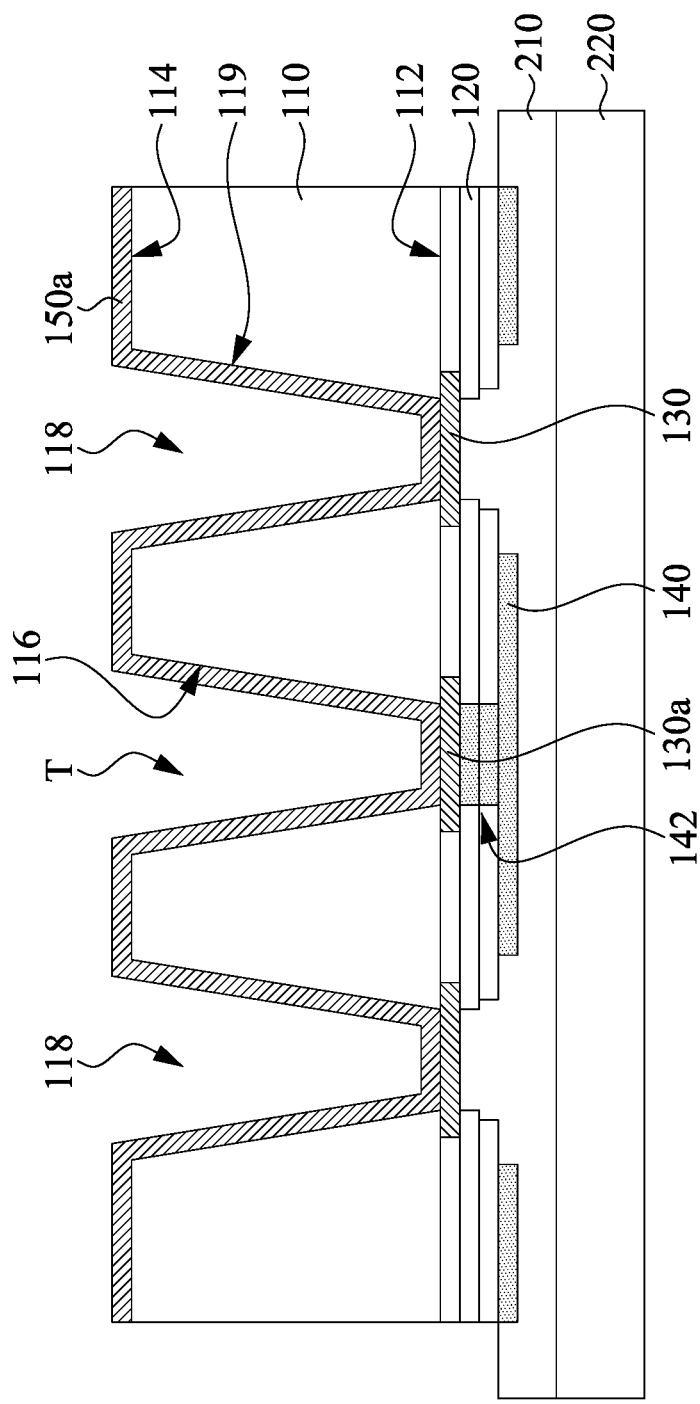

As shown in FIG. 15, afterwards, the redistribution layer 150a may be formed on the second surface 114 of the semiconductor substrate 110, the wall surface 119 of the through hole 118, the first conductive pad structure 130, the inclined sidewall 116, and the second conductive pad structure 130a, such that the redistribution layer 150a may be in contact with the second surface 114 of the semiconductor substrate 110, the wall surface 119 of the through hole 118, the first conductive pad structure 130, the inclined sidewall 116, and the second conductive pad structure 130a.

Figure 16:
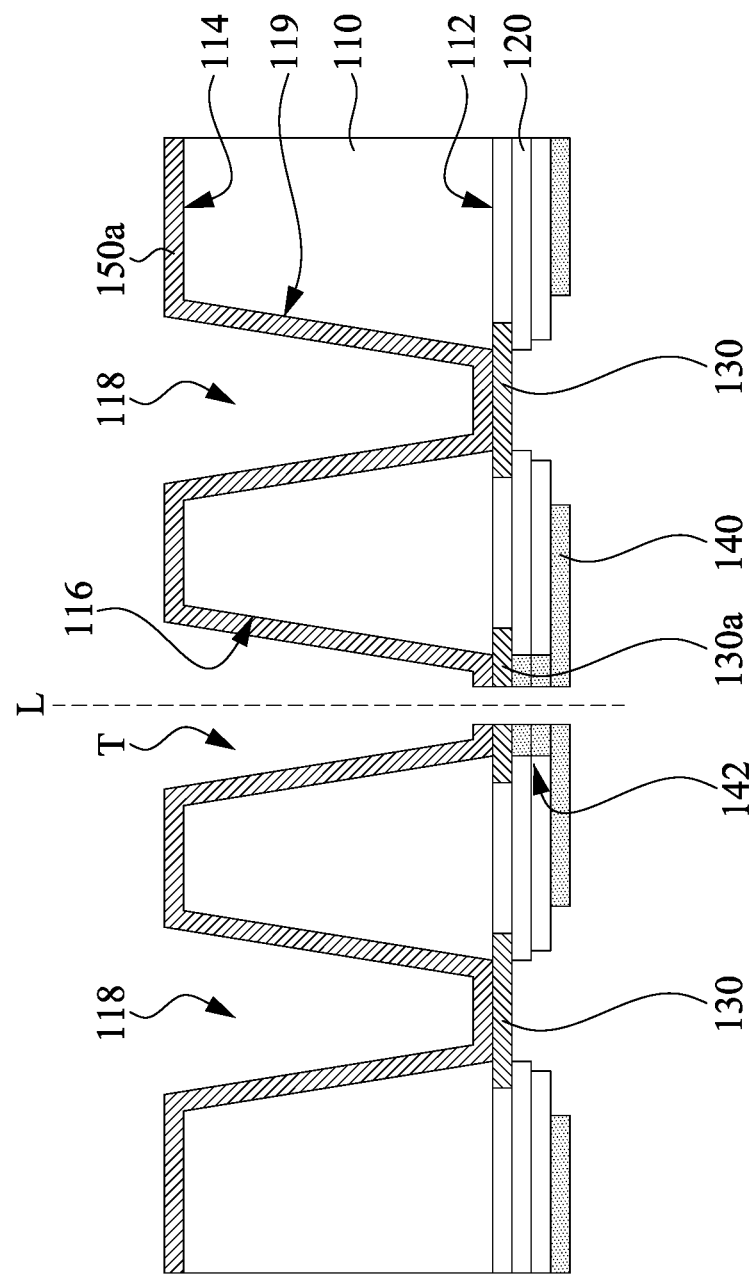

As shown in FIG. 16, after the formation of the redistribution layer 150a, the bonding layer 210 and the cover 220 may be removed. Subsequently, the semiconductor substrate 110 may be cut along the dicing trench T (e.g., line L) to obtain the chip package 100a of FIG. 12.

Figure 17:
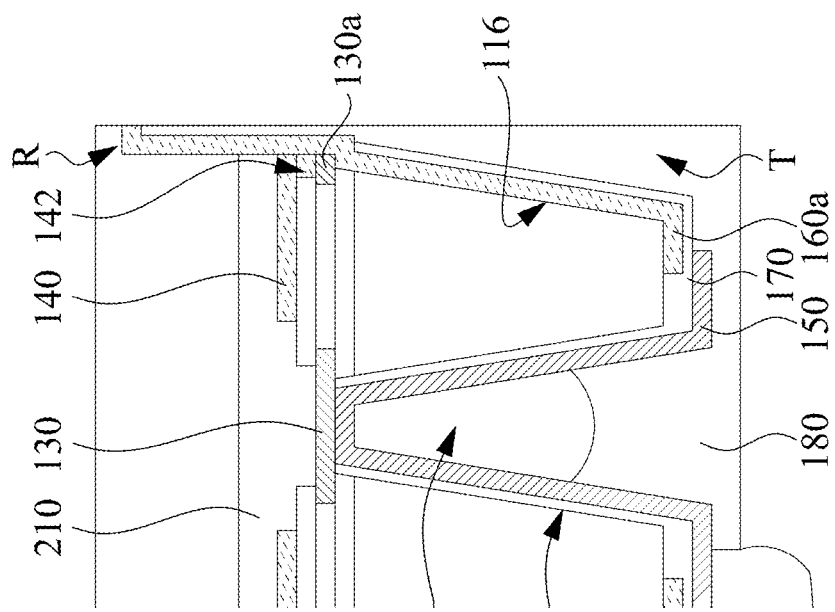
FIG. 17 is a cross-sectional view of a chip package according to one embodiment of the present disclosure.

FIG. 17 is a cross-sectional view of a chip package 100b according to one embodiment of the present disclosure. The chip package 100b includes the semiconductor substrate 110, the interlayer dielectric (ILD) layer 120, the first metal shielding layer 140, the redistribution layer 150, and a second metal shielding layer 160a. The redistribution layer 150 is in contact with the first conductive pad structure 130. The difference between this embodiment and the embodiment of FIG. 1 is that the chip package 100b further includes the bonding layer 210 and the cover 220, in which the cover 220 has a recess R, and the second metal shielding layer 160a extends from the second surface 114 of the semiconductor substrate 110 along the inclined sidewall 116 of the semiconductor substrate 110 into the recess R of the cover 220. Moreover, the bonding layer 210 covers the first conductive pad structure 130, the ILD layer 120, and the first metal shielding layer 140. The first conductive pad structure 130 is located on the bonding layer 210.

In this embodiment, the lateral surface of the second metal shielding layer 160a is in contact with the bonding layer 210, the first metal shielding layer 140, and the second conductive pad structure 130a. The material of the first metal shielding layer 140 and the material of the second metal shielding layer 160a may be the same, such as copper or aluminum. The first metal shielding layer 140 and the second metal shielding layer 160a both can provide EMI protection. The chip package 100b may be an optical sensor. The cover 220 is a transparent cover, and the material of the cover 220 may be glass.

In addition, the chip package 100b further includes the isolation layer 170. The isolation layer 170 of the chip package 100b is located between the redistribution layer 150 and the second surface 114 of the semiconductor substrate 110, and is located between the redistribution layer 150 and the wall surface 119 of the through hole 118. In this embodiment, the isolation layer 170 covers the second metal shielding layer 160a and extends into the recess R of the cover 220.

Figure 18:
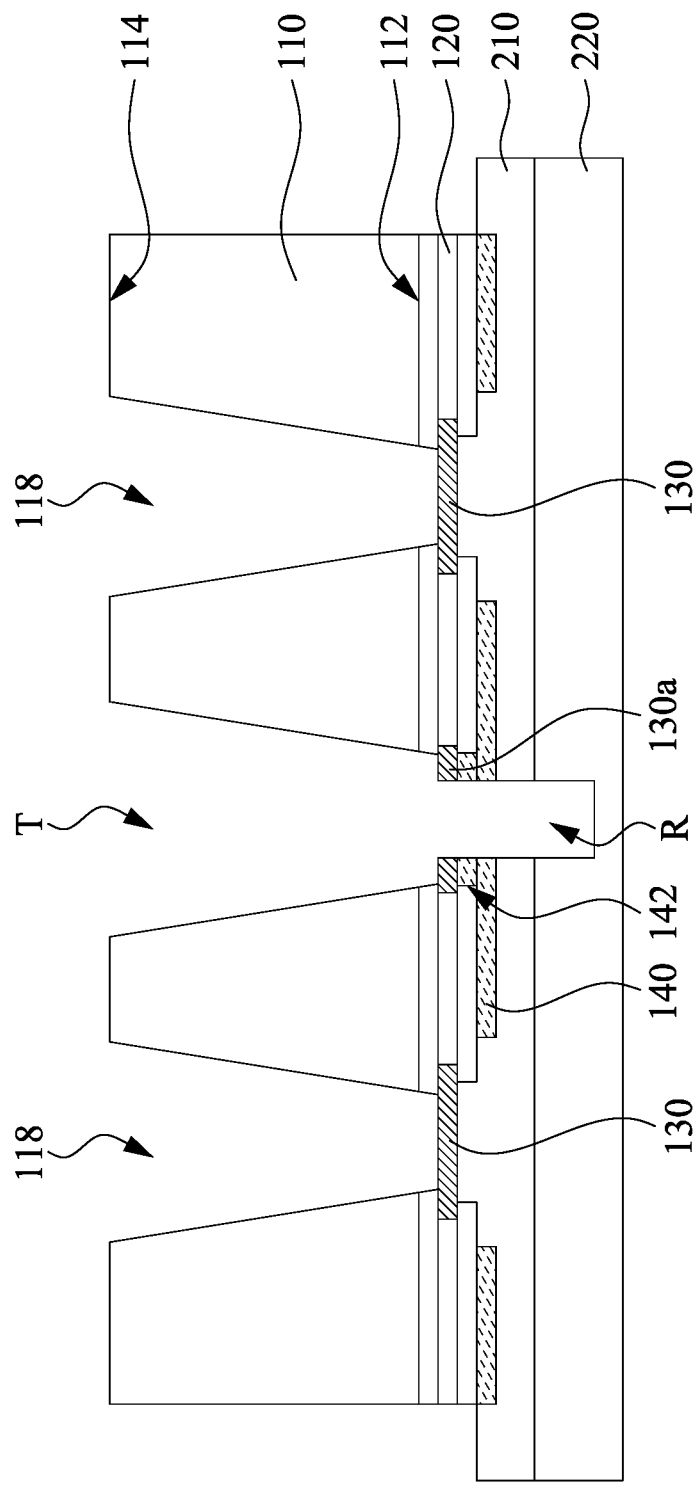
FIGS. 18 to 23 are cross-sectional views at intermediate stages of the manufacturing method of the chip package of FIG. 17.

FIGS. 18 to 23 are cross-sectional views at intermediate stages of the manufacturing method of the chip package 100b of FIG. 17. The steps prior to FIG. 18 are the same as the steps of FIGS. 2 to 4, and will not be repeated in the following description. As shown in FIG. 4 and FIG. 18, after the through hole 118 and the dicing trench T are formed in the semiconductor substrate 110, the second conductive pad structure 130a, the first metal shielding layer 140, the bonding layer 210, and the cover 220 may be cut along the dicing trench T, such that the cover 220 has the recess R in communication with the dicing trench T. Next, the ILD layer 120 above the first conductive pad structure 130 and the second conductive pad structure 130a may be etched such that the first conductive pad structure 130 is exposed through the through hole 118 and the second conductive pad structure 130a is exposed through the dicing trench T.

Figure 19:
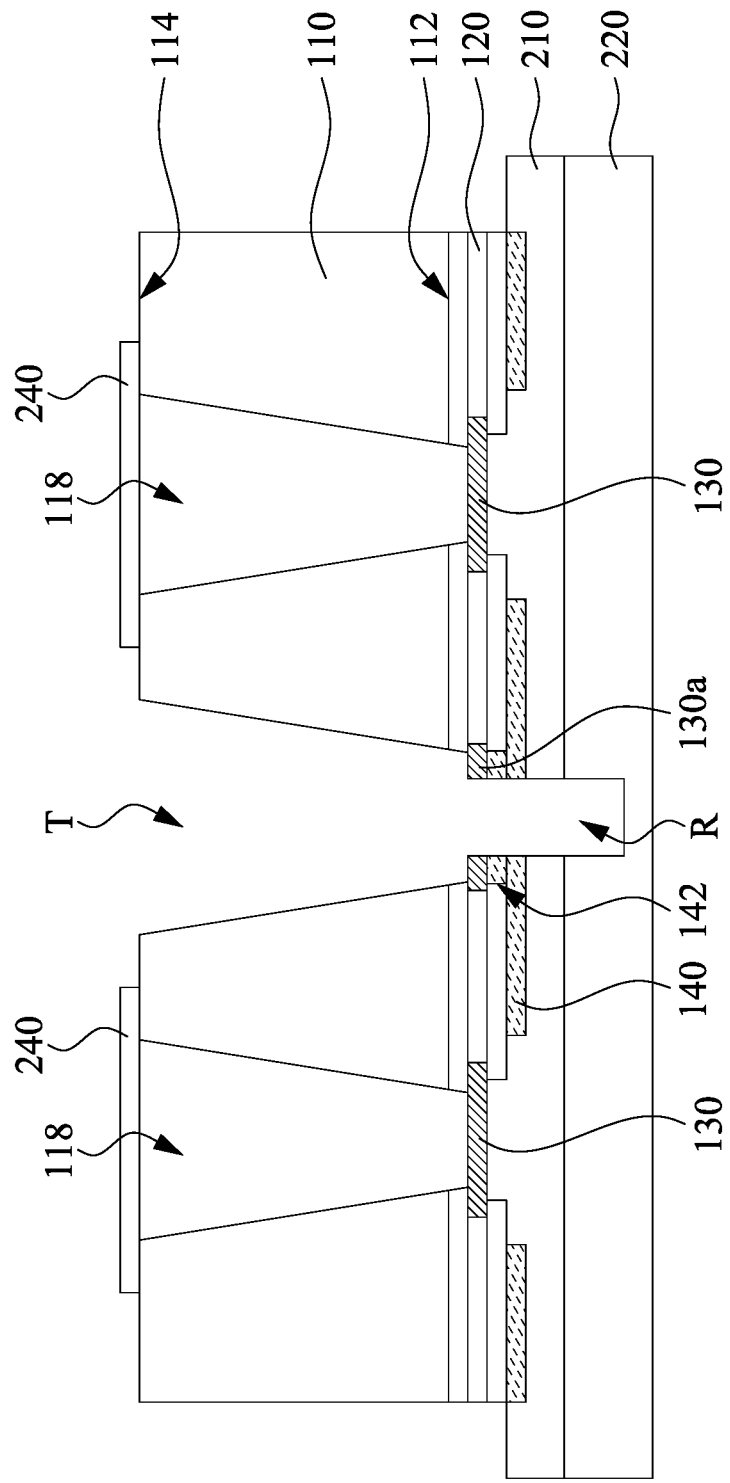

As shown in FIG. 19, thereafter, the patterned photoresist layer 240 may be formed on the second surface 114 of the semiconductor substrate 110, in which the photoresist layer 240 covers the through hole 118, and the dicing trench T is free from coverage by the photoresist layer 240.

Figure 20:
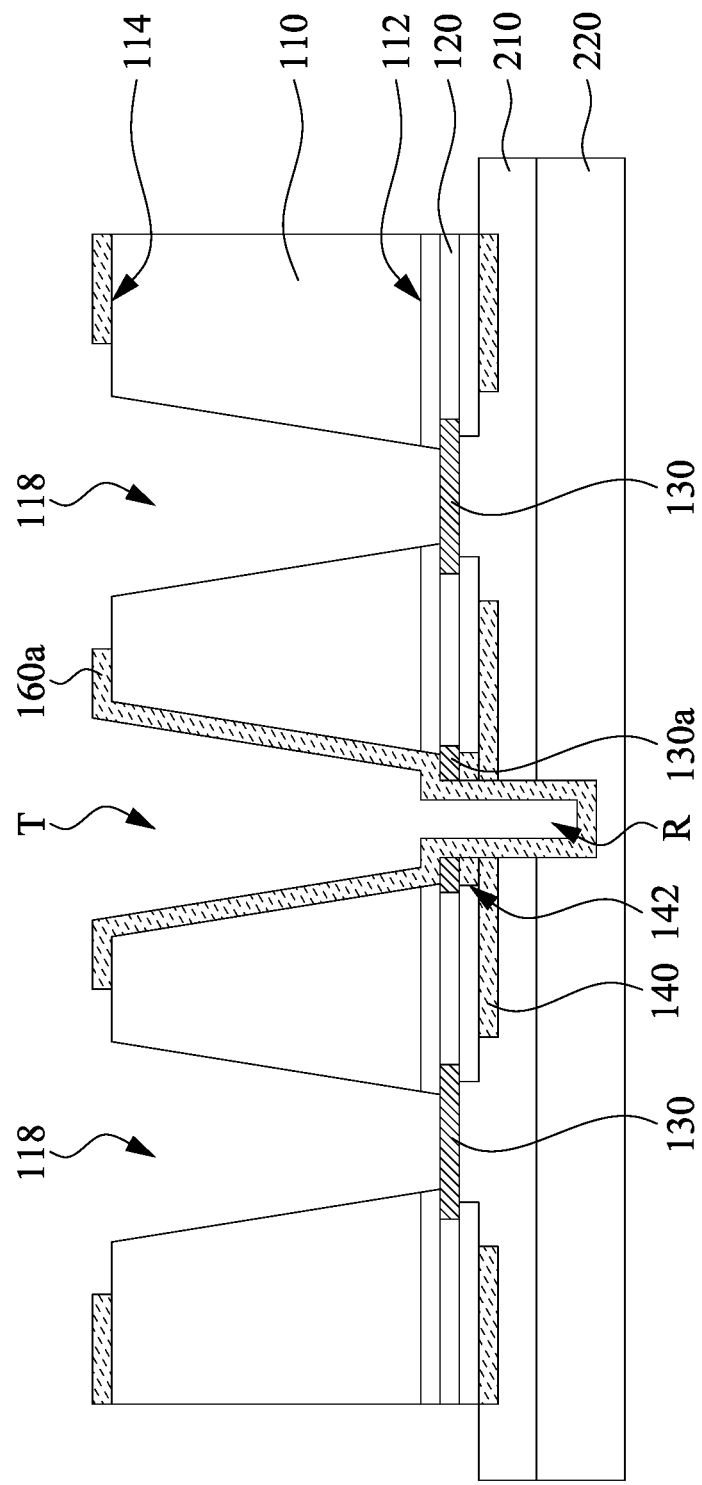

As shown in FIG. 19 and FIG. 20, after the formation of the photoresist layer 240, the second metal shielding layer 160a extending from the second surface 114 of the semiconductor substrate 110 along the inclined sidewall 116 into the recess R of the cover 220 may be formed, and the second metal shielding layer 160a is formed on the second surface 114 of the semiconductor substrate 110, the inclined sidewall 116, the second conductive pad structure 130a, and the first metal shielding layer 140. Afterwards, the photoresist layer 240 may be removed to obtain the structure of FIG. 20.

Figure 21:
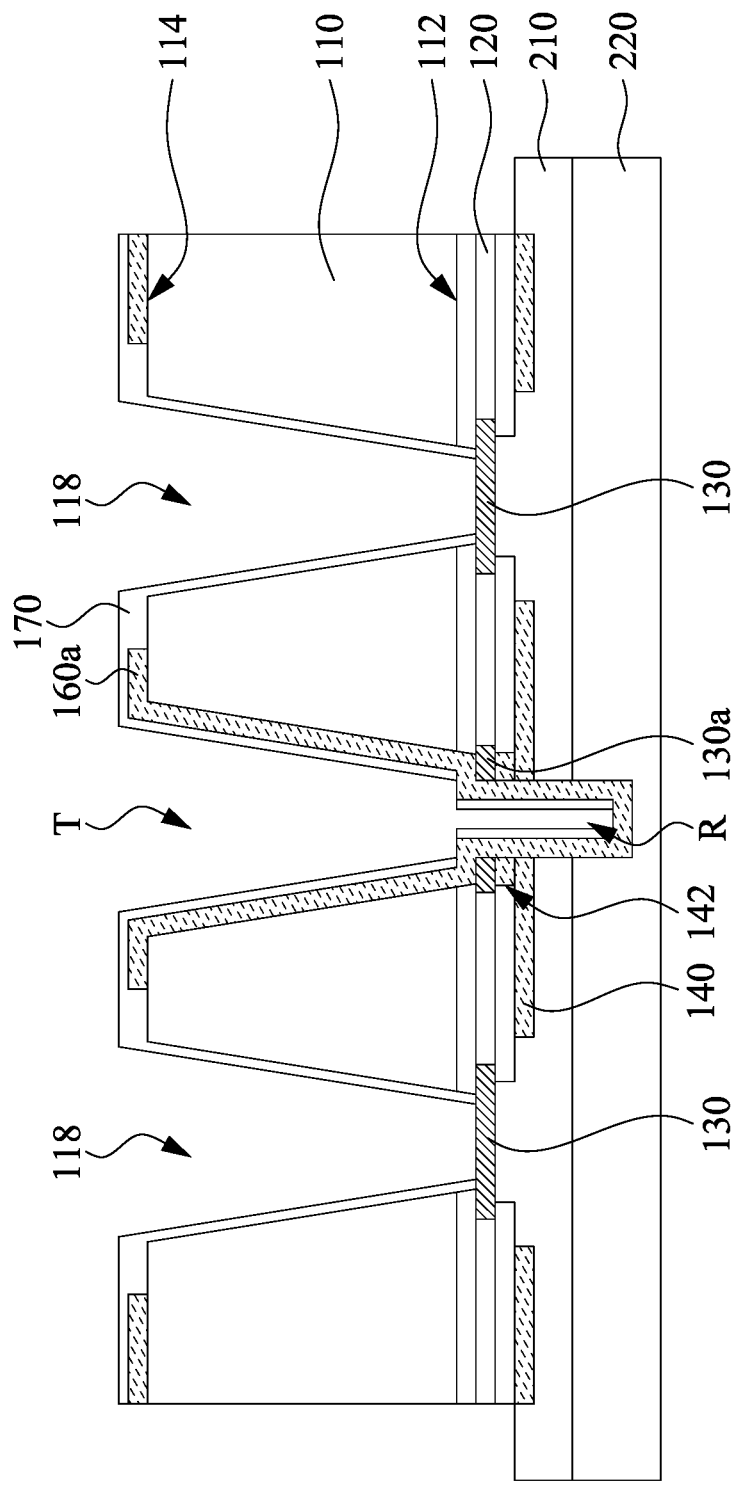

As shown in FIG. 21, thereafter, the isolation layer 170 may be formed by chemical vapor deposition (CVD), and an etching process is performed to remove portions of the isolation layer 170, thereby exposing the first conductive pad structure 130 and the second metal shielding layer 160a that is on the bottom of the dicing trench T and the bottom of the recess R. As a result, the isolation layer 170 may cover the second metal shielding layer 160a and extend into the recess R of the cover 220, and is located on the second surface 114 and the inclined sidewall 116 of the semiconductor substrate 110.

Figure 22:
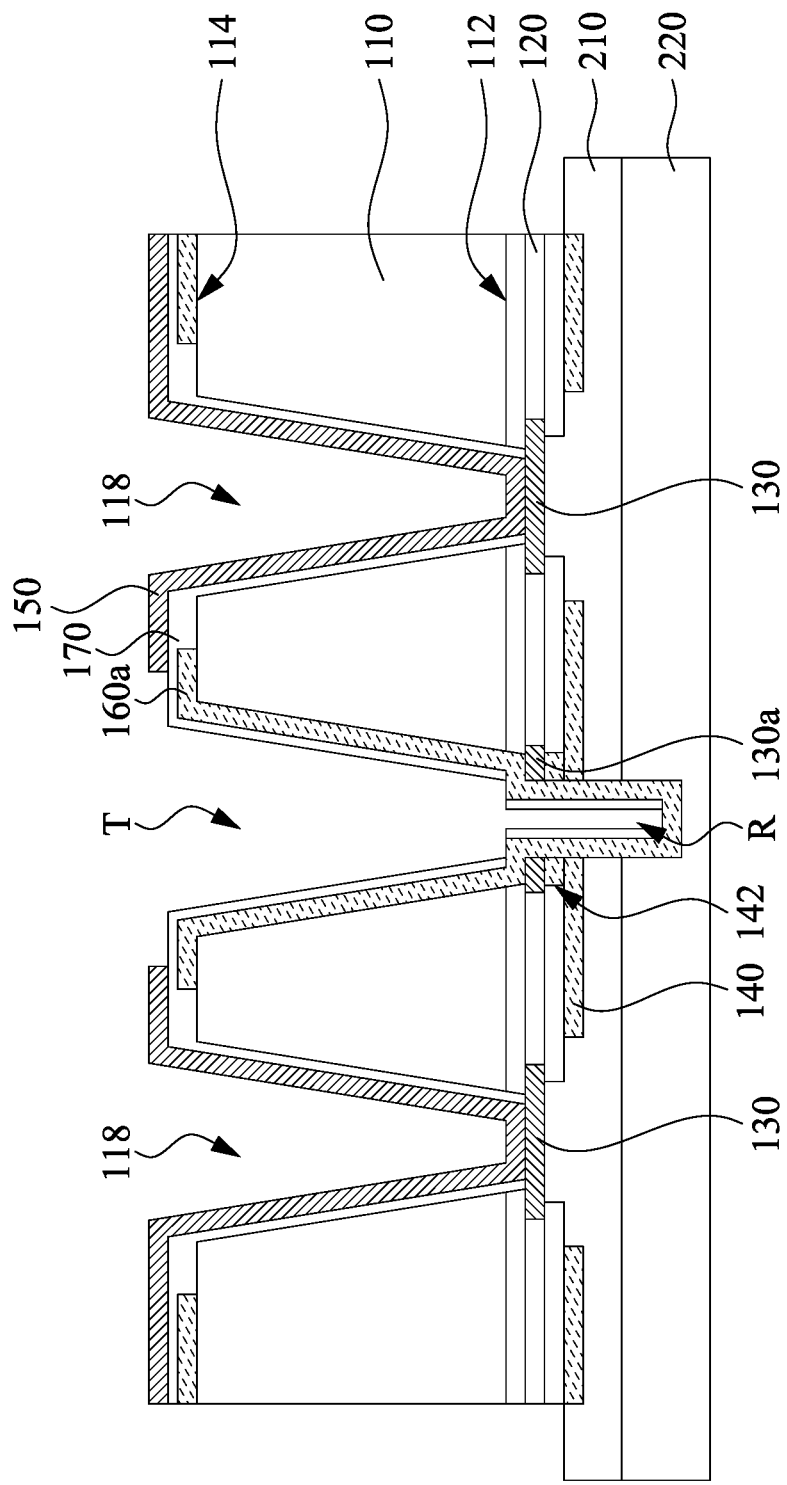

As shown in FIG. 22, next, the redistribution layer 150 may be formed on the second surface 114 of the semiconductor substrate 110, the wall surface 119 of the through hole 118, and the first conductive pad structure 130. The redistribution layer 150 and the semiconductor substrate 110 are separated by the isolation layer 170, but the redistribution layer 150 is in electrical contact with the first conductive pad structure 130.

Figure 23:
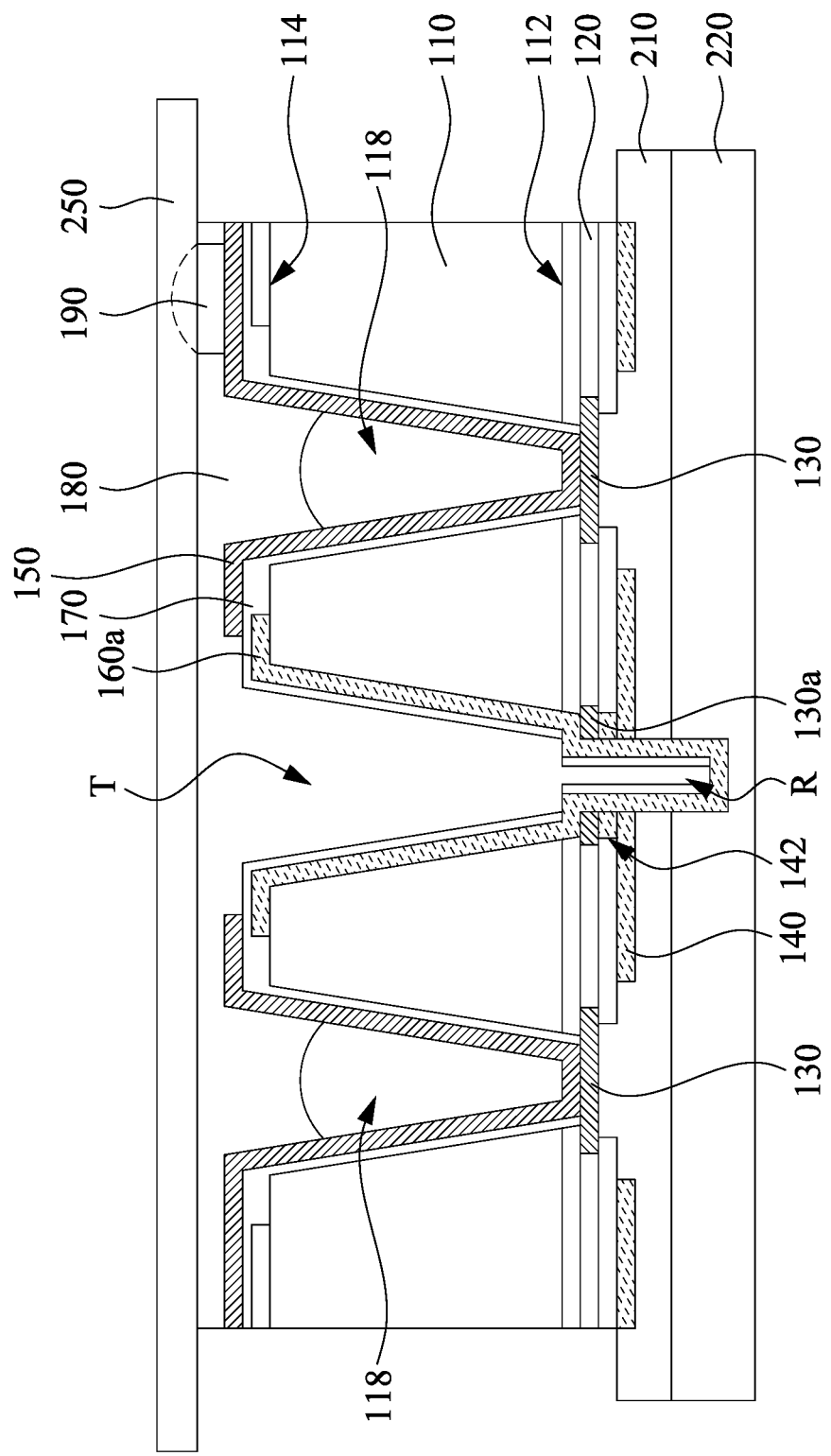

As shown in FIG. 23, after the formation of the redistribution layer 150, the protection layer 180 may be formed to cover the redistribution layer 150 and the isolation layer 170. Thereafter, the protection layer 180 may be patterned to expose a portion of the redistribution layer 150, and then the conductive structure 190 is formed on said portion of the redistribution layer 150. After the formation of the conductive structure 190, the protection layer 180 and the conductive structure 190 on the semiconductor substrate 110 may be adhered to an adhesive tape 250. Afterwards, the cover 220 and the protection layer 180 may be cut along the dicing trench T and the recess R. Subsequently, the adhesive tape 250 is removed while the bonding layer 210 and the cover 220 are retained. As a result, the chip package 100b of FIG. 17 can be obtained.

Figure 24:
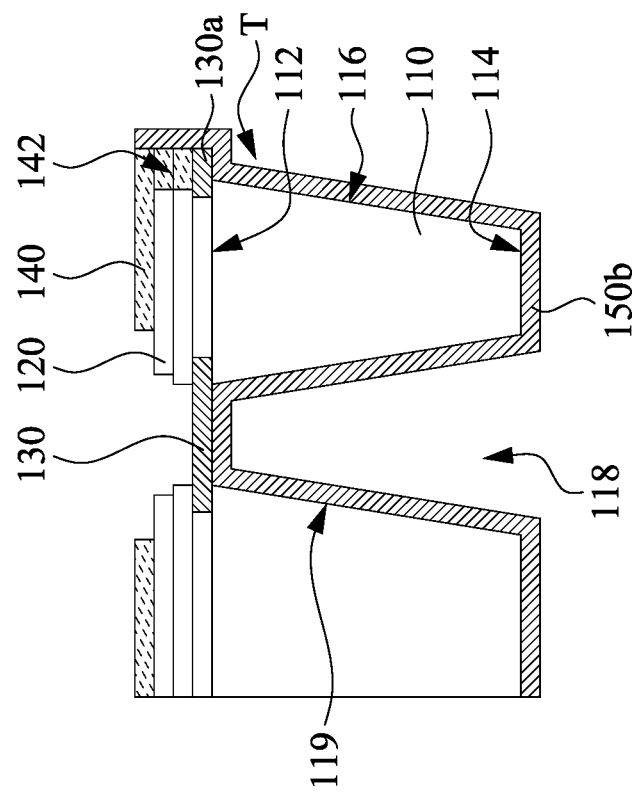
FIG. 24 is a cross-sectional view of a chip package according to one embodiment of the present disclosure.

FIG. 24 is a cross-sectional view of a chip package 100c according to one embodiment of the present disclosure. The chip package 100c includes the semiconductor substrate 110, the interlayer dielectric (ILD) layer 120, the first metal shielding layer 140, and a redistribution layer 150b. The redistribution layer 150b is in contact with the first conductive pad structure 130. The difference between this embodiment and the embodiment of FIG. 12 is that the redistribution layer 150b of the chip package 100c extends from the second surface 114 of the semiconductor substrate 110 along the inclined sidewall 116 of the semiconductor substrate 110 to the lateral surface of the first metal shielding layer 140. In this embodiment, the redistribution layer 150b of the chip package 100c has a shielding function similar to that of the aforementioned second metal shielding layer 160a.

Figure 25:
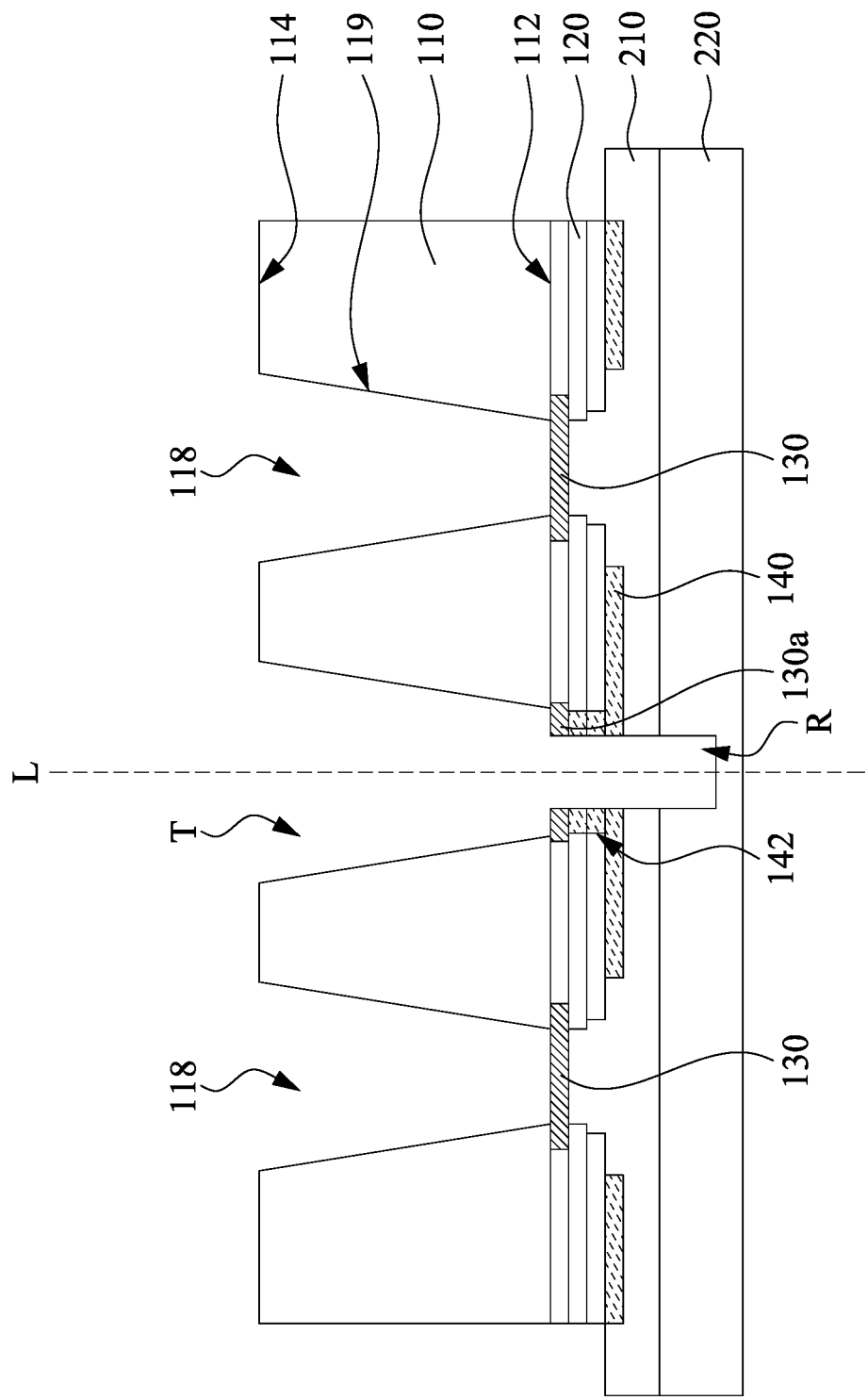
FIGS. 25 to 27 are cross-sectional views at intermediate stages of the manufacturing method of the chip package of FIG. 24.
Figure 26:
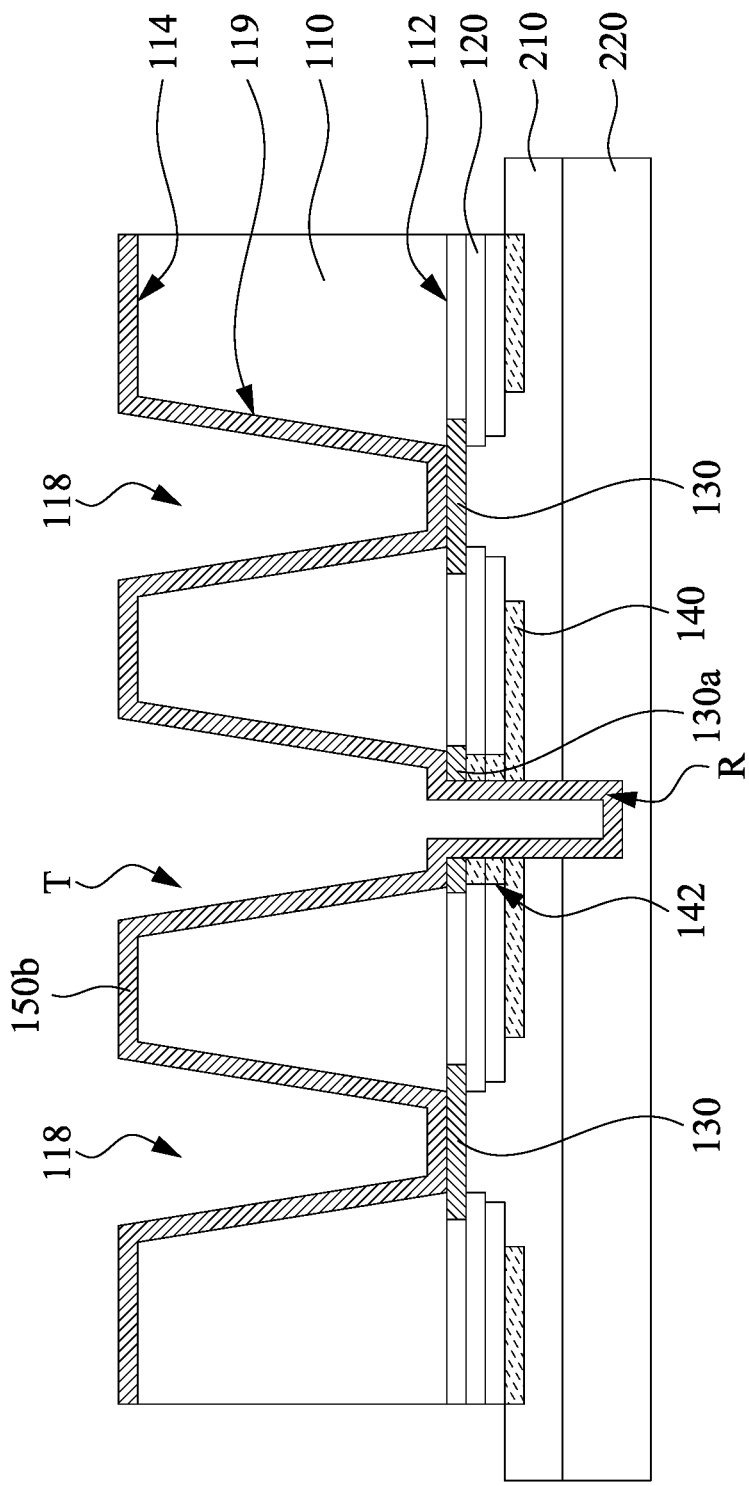
Figure 27:
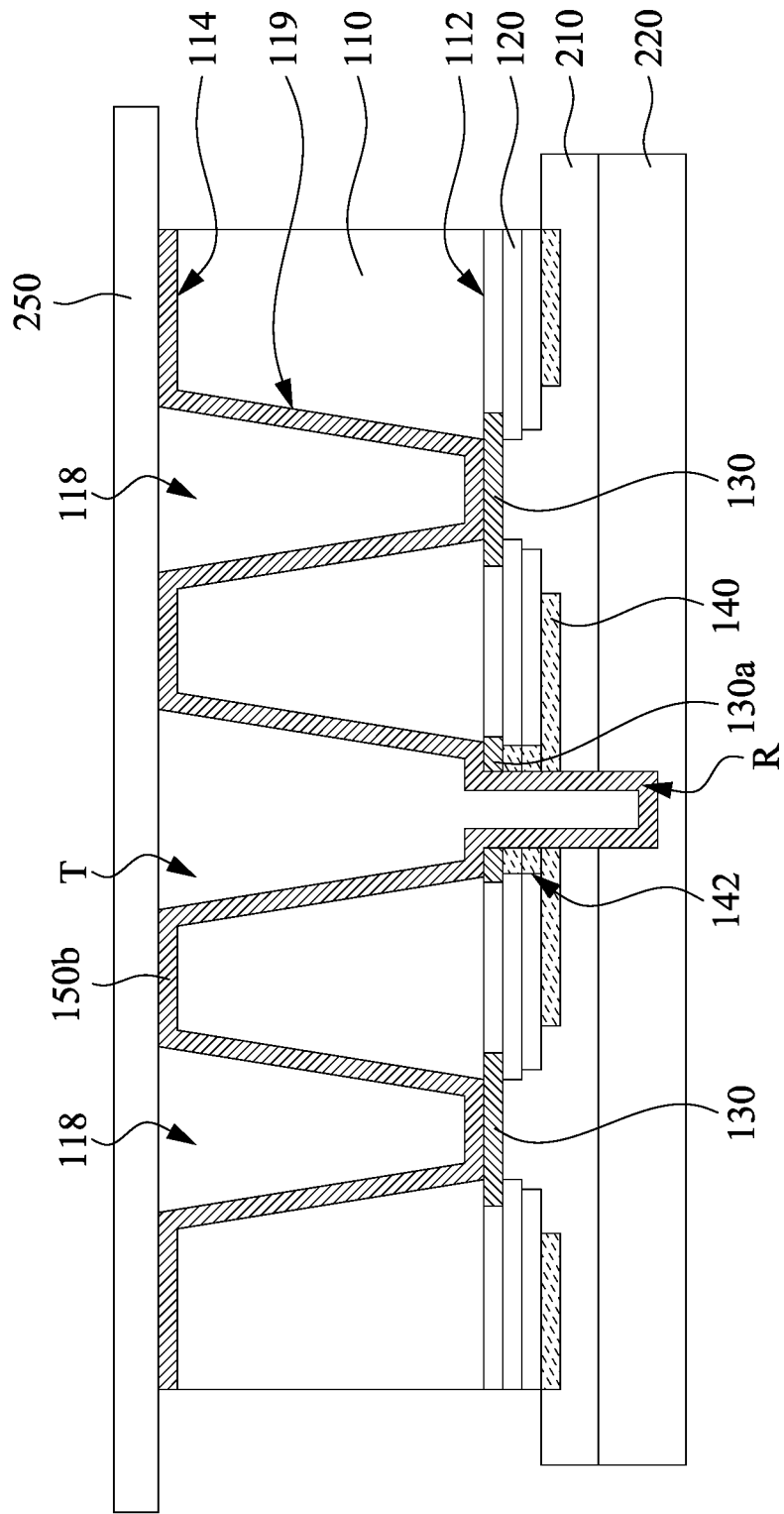

FIGS. 25 to 27 are cross-sectional views at intermediate stages of the manufacturing method of the chip package 100c of FIG. 24. The steps prior to FIG. 25 are the same as the steps of FIGS. 13 to 14, and will not be repeated in the following description. As shown in FIG. 14 and FIG. 25, after the formation of the through hole 118 and the dicing trench T, the first conductive pad structure 130 may be exposed through the through hole 118, and the second conductive pad structure 130a may be exposed through the dicing trench T. In the subsequent process, the second conductive pad structure 130a, the first metal shielding layer 140, the bonding layer 210, and the cover 220 may be cut along the dicing trench T (e.g., line L), such that the cover 220 has the recess R in communication with the dicing trench T.

As shown in FIG. 26, next, the redistribution layer 150b may be formed such that the redistribution layer 150b extends from the second surface 114 of the semiconductor substrate 110 along the inclined sidewall 116 of the semiconductor substrate 110 to the lateral surface of the first metal shielding layer 140, and the redistribution layer 150b is formed on the second surface 114 of the semiconductor substrate 110, the wall surface 119 of the through hole 118, and the first conductive pad structure 130. The redistribution layer 150b may be in contact with the second conductive pad structure 130a, the first metal shielding layer 140, the second surface 114 of the semiconductor substrate 110, the wall surface 119 of the through hole 118, and the first conductive pad structure 130.

As shown in FIG. 27, after the formation of the redistribution layer 150b, the redistribution layer 150b on the semiconductor substrate 110 may be adhered to the adhesive tape 250. Thereafter, the bonding layer 210 and the cover 220 may be removed, thereby obtaining the chip package 100c of FIG. 24.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip package, comprising:
    a semiconductor substrate having a first surface, a second surface facing away from the first surface, an inclined sidewall adjoining the first and second surfaces, and a through hole through the first and second surfaces;
    an interlayer dielectric (ILD) layer located on the first surface of the semiconductor substrate, wherein a first conductive pad structure and a second conductive pad structure are disposed in the ILD layer;
    a first metal shielding layer located on the ILD layer, wherein a portion of the first metal shielding layer is located in the ILD layer and on the second conductive pad structure;
    a redistribution layer located on the second surface of the semiconductor substrate, a wall surface of the through hole, and the first conductive pad structure;
    a bonding layer covering the first conductive pad structure, the ILD layer, and the first metal shielding layer;
    a cover located on the bonding layer and having a recess; and
    a second metal shielding layer extending from the second surface of the semiconductor substrate along the inclined sidewall of the semiconductor substrate into the recess of the cover.

2. The chip package of claim 1, wherein the second metal shielding layer is located on the second surface of the semiconductor substrate and the inclined sidewall.

3. The chip package of claim 2, wherein the second metal shielding layer is in electrical contact with the second conductive pad structure.

4. The chip package of claim 2, wherein a material of the first metal shielding layer is the same as a material of the second metal shielding layer.

5. The chip package of claim 2, wherein a material of the second metal shielding layer comprises copper or aluminum.

6. The chip package of claim 2, further comprising:
    an isolation layer covering the second metal shielding layer, located between the redistribution layer and the second surface of the semiconductor substrate, and located between the redistribution layer and the wall surface of the through hole.

7. The chip package of claim 6, further comprising:
    a protection layer covering the redistribution layer and the isolation layer.

8. The chip package of claim 7, further comprising:
    a conductive structure protruding from the protection layer and in electrical contact with the redistribution layer that is on the second surface.

9. The chip package of claim 1, wherein a material of the first metal shielding layer comprises copper or aluminum.

10. The chip package of claim 1, wherein the redistribution layer is in contact with the second surface of the semiconductor substrate, the wall surface of the through hole, and the first conductive pad structure.

11. The chip package of claim 1, wherein the redistribution layer is in electrical contact with the second conductive pad structure.

12. The chip package of claim 1, wherein a lateral surface of the second metal shielding layer is in contact with the bonding layer and the first metal shielding layer.

13. The chip package of claim 1, further comprising:
    an isolation layer covering the second metal shielding layer and extending into the recess of the cover.

14. The chip package of claim 1, wherein the redistribution layer extends from the second surface of the semiconductor substrate along the inclined sidewall of the semiconductor substrate to a lateral surface of the first metal shielding layer.

15. A manufacturing method of a chip package, comprising:
    forming a first metal shielding layer on an interlayer dielectric (ILD) layer on a first surface of a semiconductor substrate, wherein a first conductive pad structure and a second conductive pad structure are disposed in the ILD layer, and a portion of the first metal shielding layer is located in the ILD layer and on the second conductive pad structure;
    bonding, by a bonding layer, the first metal shielding layer to a cover, wherein the bonding layer covers the first conductive pad structure, the ILD layer, and the first metal shielding layer;
    forming a through hole in the semiconductor substrate, wherein the through hole through the first surface and a second surface that faces away from the first surface;
    when forming the through hole in the semiconductor substrate, simultaneously forming a dicing trench in the semiconductor substrate, such that the semiconductor substrate has an inclined sidewall facing toward the dicing trench;
    cutting the second conductive pad structure, the first metal shielding layer, the bonding layer, and the cover along the dicing trench, such that the cover has a recess in communication with the dicing trench;
    forming a second metal shielding layer that extends from the second surface of the semiconductor substrate along the inclined sidewall of the semiconductor substrate into the recess of the cover; and
    forming a redistribution layer on the second surface of the semiconductor substrate, a wall surface of the through hole, and the first conductive pad structure.

16. The manufacturing method of the chip package of claim 15, further comprising:
    etching the ILD layer to expose the first conductive pad structure and the second conductive pad structure.

17. The manufacturing method of the chip package of claim 16, further comprising:
    forming a photoresist layer on the second surface of the semiconductor substrate, wherein the photoresist layer covers the through hole, and the dicing trench is free from coverage by the photoresist layer.

18. The manufacturing method of the chip package of claim 17,
    wherein the second metal shielding layer is located on the second surface of the semiconductor substrate, the inclined sidewall, and the second conductive pad structure, and the manufacturing method further comprises:
removing the photoresist layer.

19. The manufacturing method of the chip package of claim 18, further comprising:
forming an isolation layer on the second metal shielding layer, the second surface of the semiconductor substrate, and the inclined sidewall; and
forming a protection layer to cover the redistribution layer and the isolation layer.

20. The manufacturing method of the chip package of claim 19, further comprising:
forming an opening in the protection layer to expose a portion of the redistribution layer; and
forming a conductive structure on said portion of the redistribution layer.

21. The manufacturing method of the chip package of claim 16, further comprising:
cutting the semiconductor substrate along the dicing trench.

22. The manufacturing method of the chip package of claim 16, further comprising:
forming an isolation layer that covers the second metal shielding layer and extends into the recess of the cover.

23. The manufacturing method of the chip package of claim 16, further comprising:
forming the redistribution layer such that the redistribution layer extends from the second surface of the semiconductor substrate along the inclined sidewall of the semiconductor substrate to a lateral surface of the first metal shielding layer.

24. The manufacturing method of the chip package of claim 15, wherein forming the redistribution layer on the second surface of the semiconductor substrate, the wall surface of the through hole, and the first conductive pad structure is performed such that the redistribution layer is in contact with the second surface, the wall surface of the through hole, and the first conductive pad structure.

25. The manufacturing method of the chip package of claim 15, further comprising:
after forming the redistribution layer, adhering the semiconductor substrate to an adhesive tape.

* * * * *